United States Patent
Khwa et al.

(10) Patent No.: US 9,558,823 B1
(45) Date of Patent: Jan. 31, 2017

(54) RESISTANCE DRIFT RECOVERY METHOD FOR MLC PCM

(71) Applicant: MACRONIX INTERNATIONAL CO., LTD., Hsinchu (TW)

(72) Inventors: Win-San Khwa, Taipei (TW); Tzu-Hsiang Su, Hsinchu (TW); Chao-I Wu, Hsinchu (TW); Hsiang-Pan Li, Hsinchu (TW); Meng-Fan Chang, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/846,393

(22) Filed: Sep. 4, 2015

(51) Int. Cl.
*G11C 11/00* (2006.01)
*G11C 13/00* (2006.01)
*G11C 11/56* (2006.01)

(52) U.S. Cl.
CPC ....... *G11C 13/0069* (2013.01); *G11C 11/5678* (2013.01); *G11C 13/004* (2013.01); *G11C 13/0004* (2013.01)

(58) Field of Classification Search
CPC ............ G11C 13/0069; G11C 13/0004; G11C 13/0007; G11C 13/004; G11C 11/5678; G11C 13/0064; G11C 2013/0083
USPC .................................. 365/158, 163, 148, 100
See application file for complete search history.

(56) References Cited

U.S. PATENT DOCUMENTS

| | | | | |
|---|---|---|---|---|
| 6,914,801 B2* | 7/2005 | Kostylev | ............ | G11C 13/0004 365/113 |
| 7,940,552 B2* | 5/2011 | Chang-Wook | .......... | G11C 11/56 365/148 |
| 9,064,573 B2* | 6/2015 | Kawai | ................ | G11C 13/0069 |

OTHER PUBLICATIONS

Ciocchini, N. et al., "Modeling Resistance Instabilities of Set and Reset States in Phase Change Memory With Ge-Rich GeSbTe," Electron Devices, IEEE Transactions on , vol. 61, No. 6, pp. 2136,2144, Jun. 2014.
Khwa et al., "A Procedure to Reduce Cell Variation in Phase Change Memory for Improving Multi-Level-Cell Performances," Memory Workshop (IMW), 2015 IEEE 7th International , vol., No., pp. 1-4, May 17-20, 2015.
R. Fallica, et al., "Thermal and Electrical Characterization of Materials for Phase-Change Memory Cells," J. Chem. Eng. Data, vol. 54, pp. 1698-1701, 2009.

* cited by examiner

*Primary Examiner* — David Lam
(74) *Attorney, Agent, or Firm* — Yiding Wu; Haynes Beffel & Wolfeld LLP

(57) ABSTRACT

A method is provided for operating a memory device including an array of memory cells including programmable resistive memory elements. Memory cells in the array are programmed to store data by applying program pulses to the memory cells to establish resistance levels within a number N of specified ranges of resistance, where each of the specified ranges corresponds to a particular data value. A drift recovery process is executed to the memory cells, including applying a recovery pulse having a pulse shape to (Continued)

a set of programmed memory cells, where memory cells in the set have resistance levels within two or more of the specified resistance ranges.

22 Claims, 17 Drawing Sheets

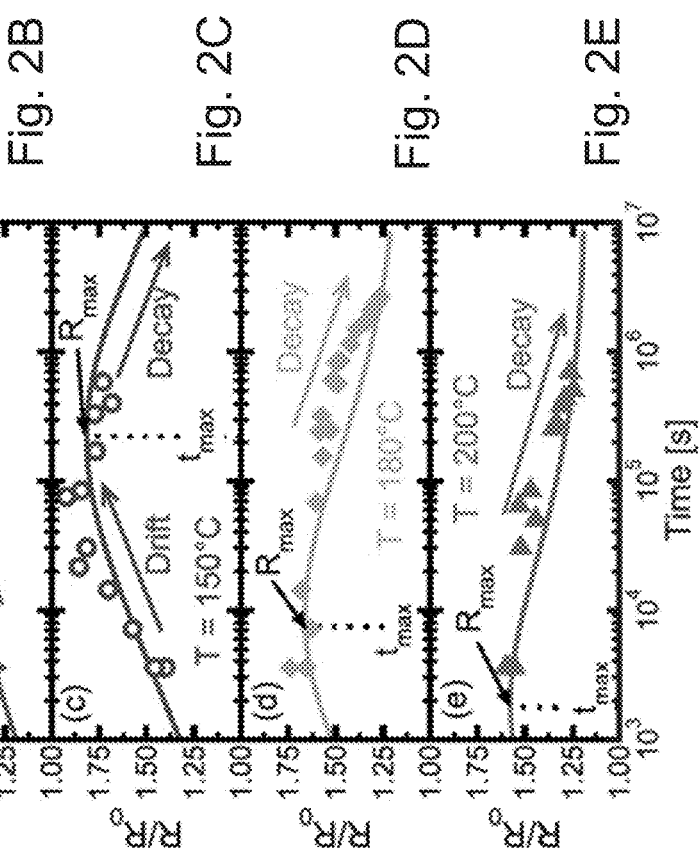

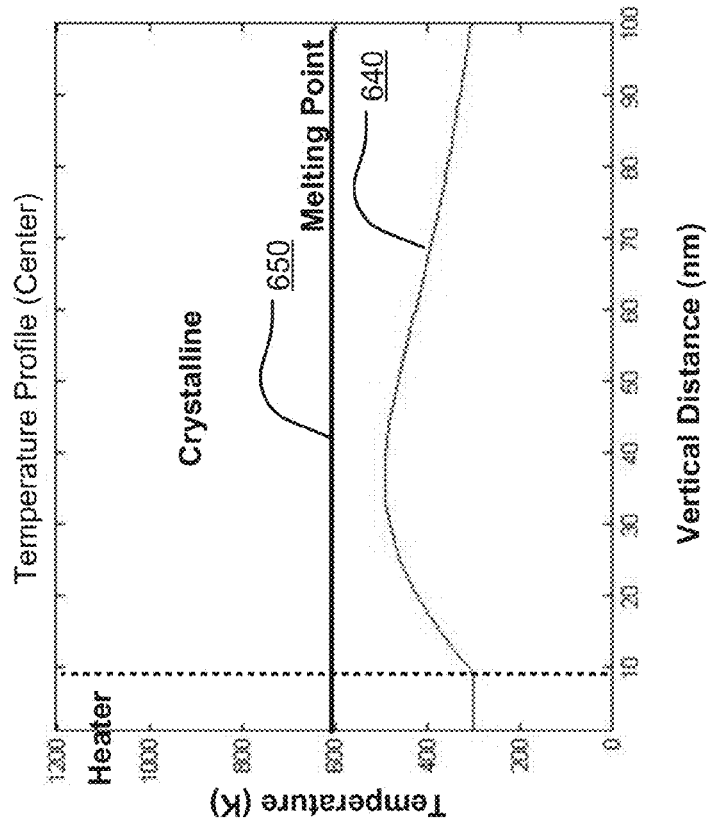
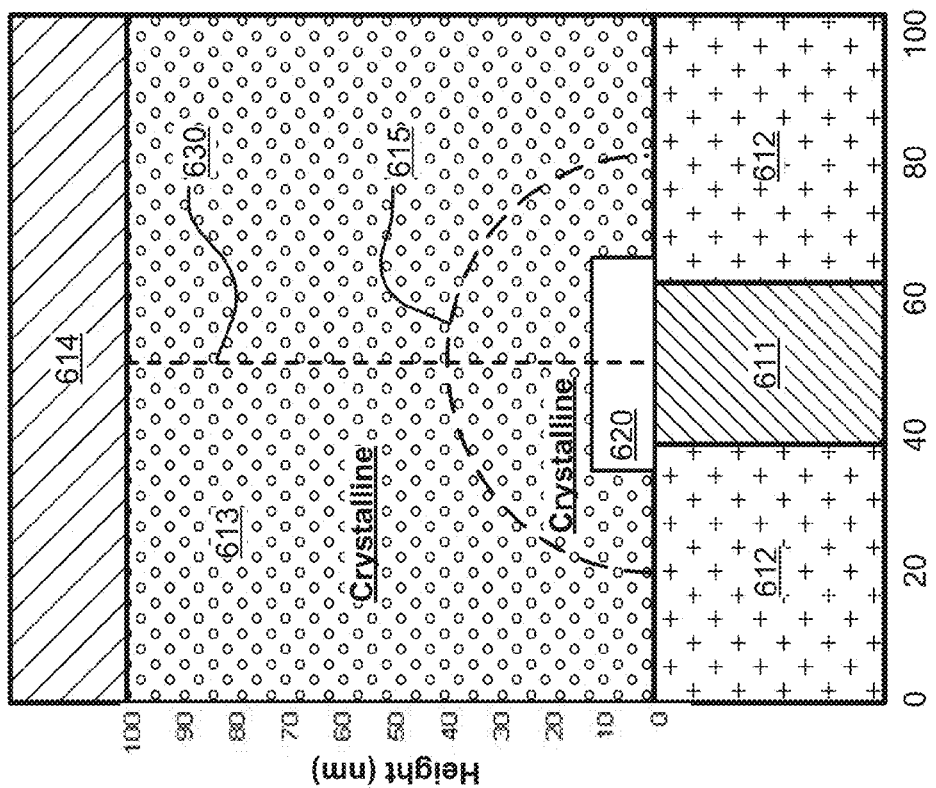
Fig. 6B
Fig. 6A

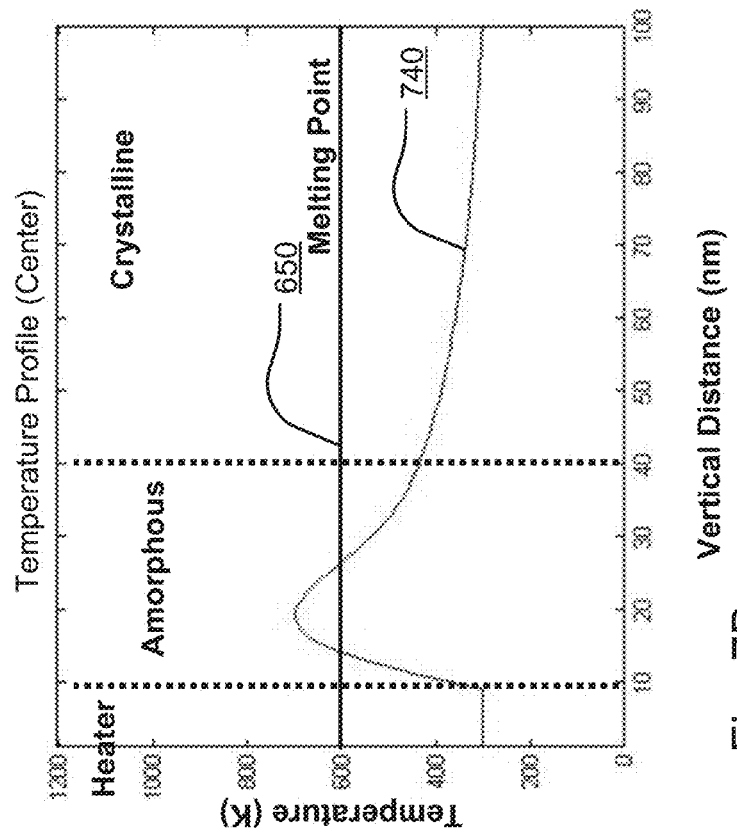
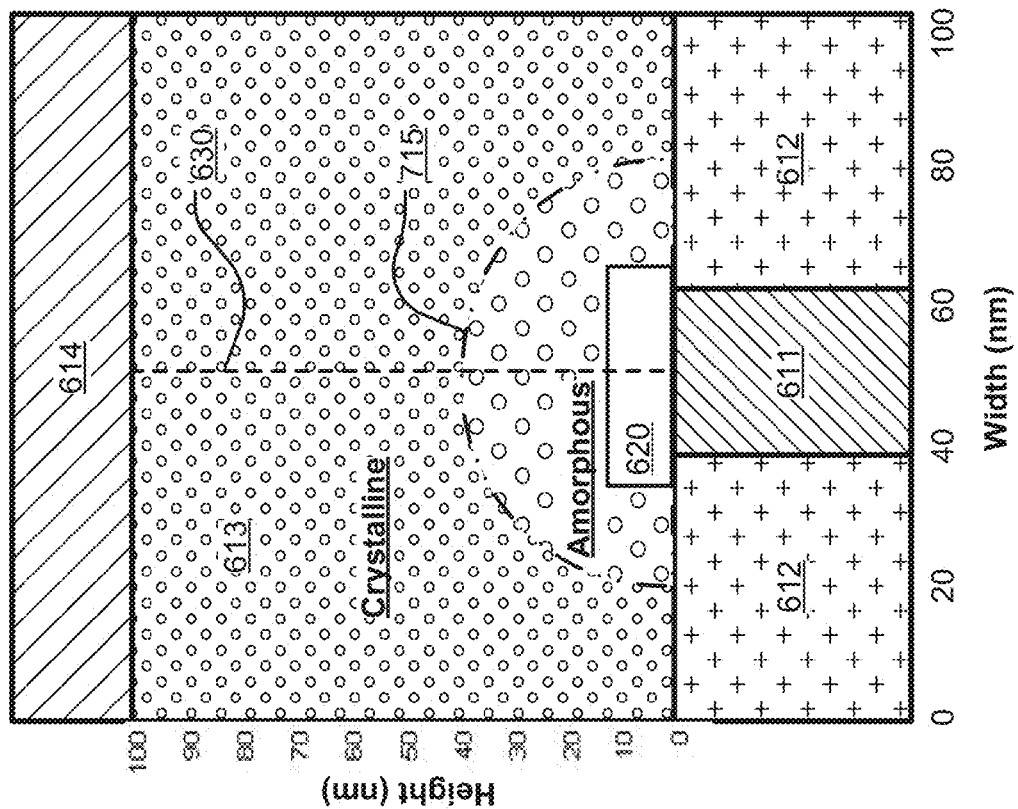
Fig. 7B
Fig. 7A

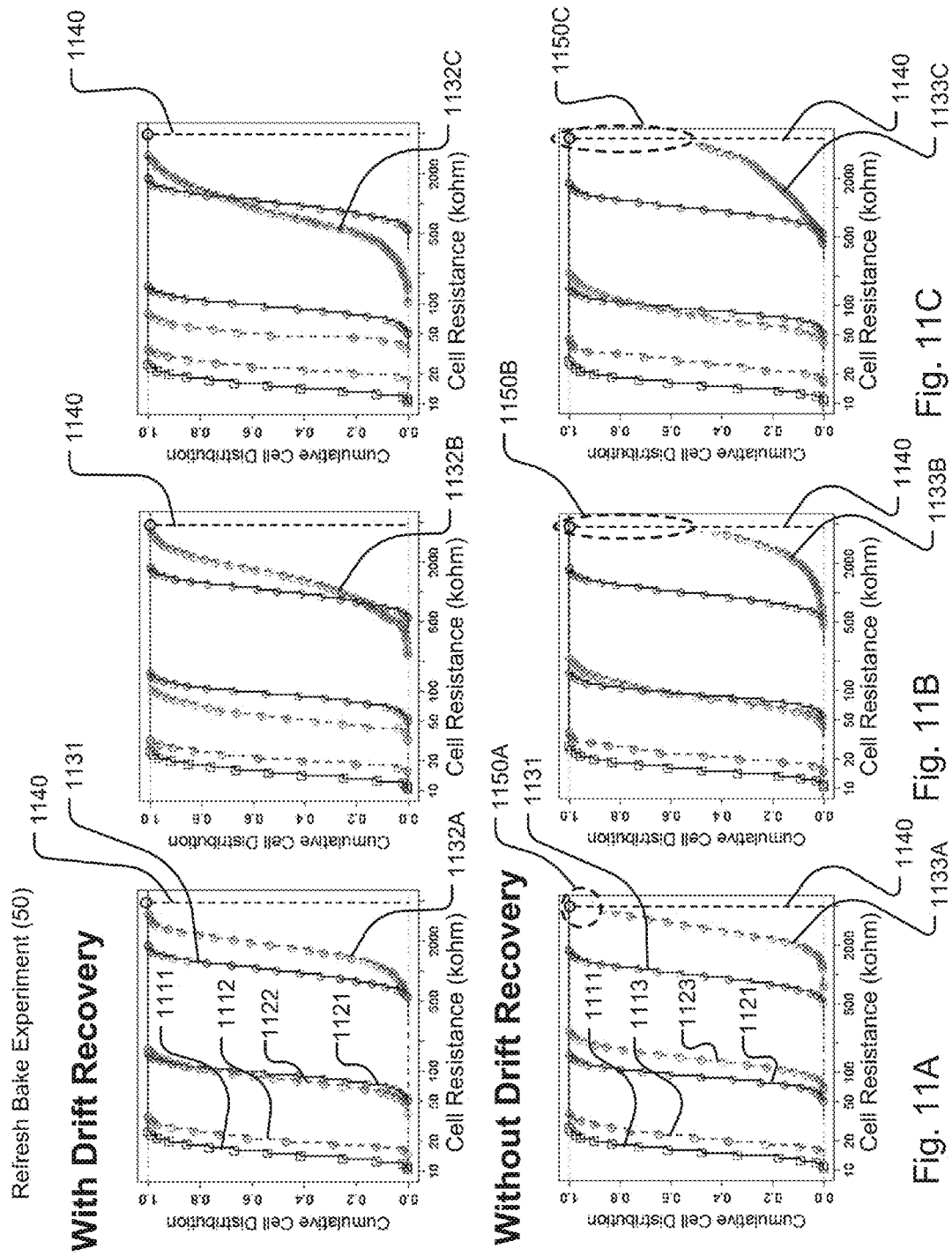

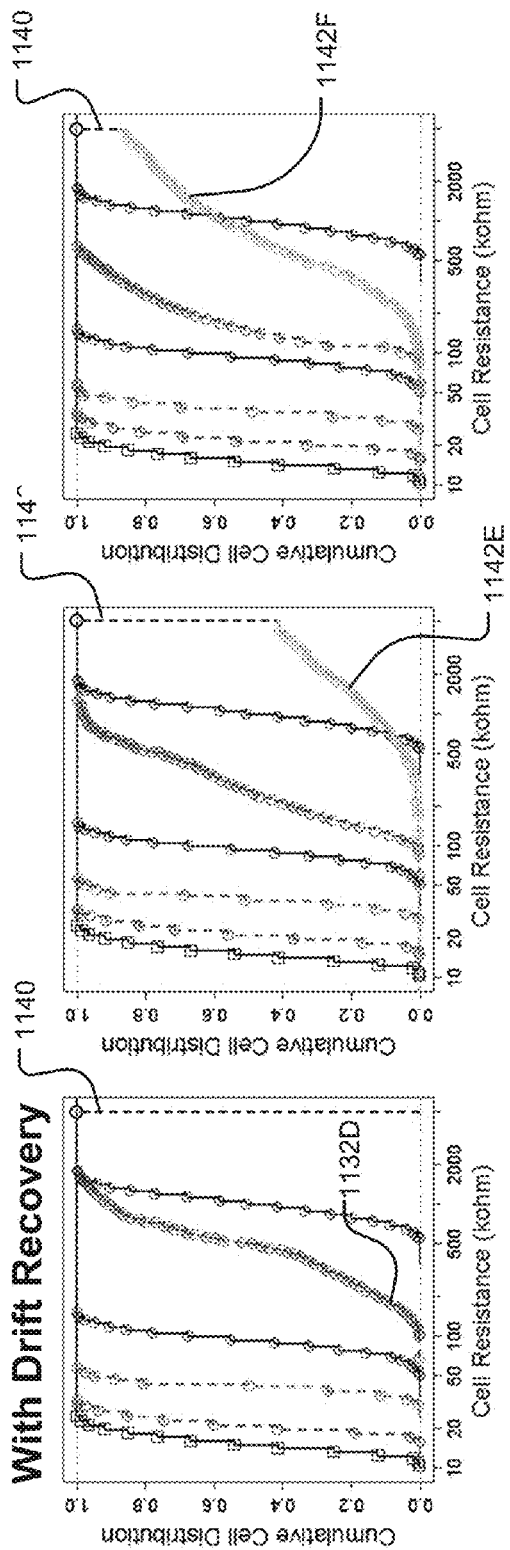
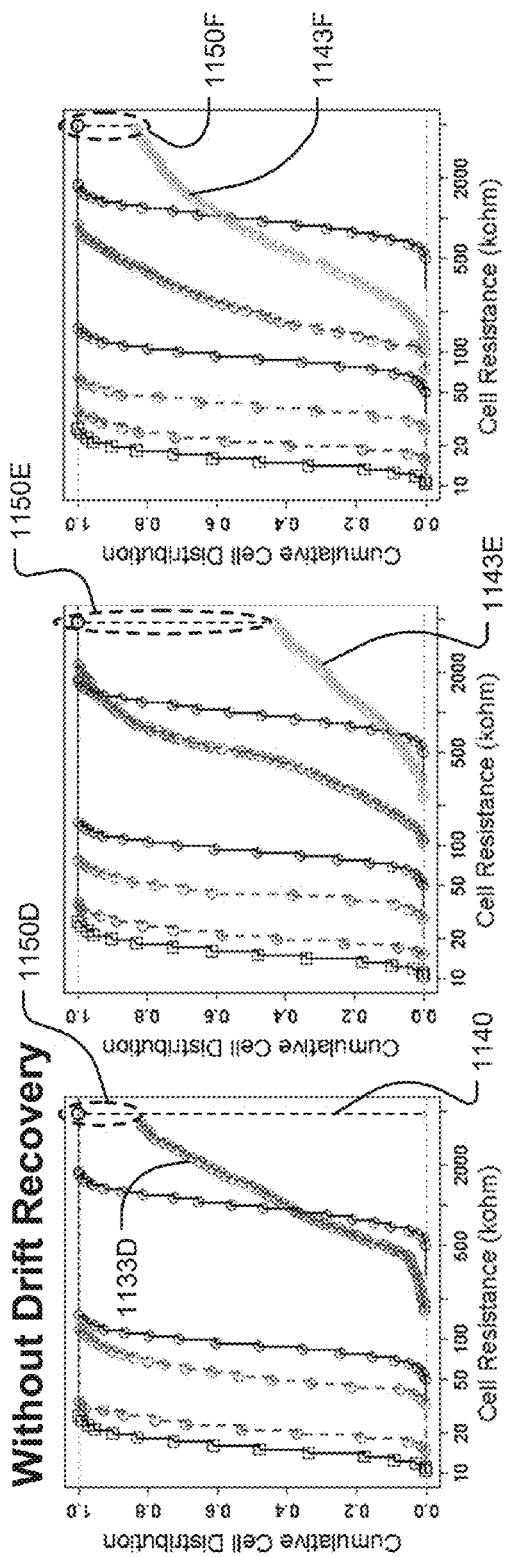
Fig. 11D  Fig. 11E  Fig. 11F

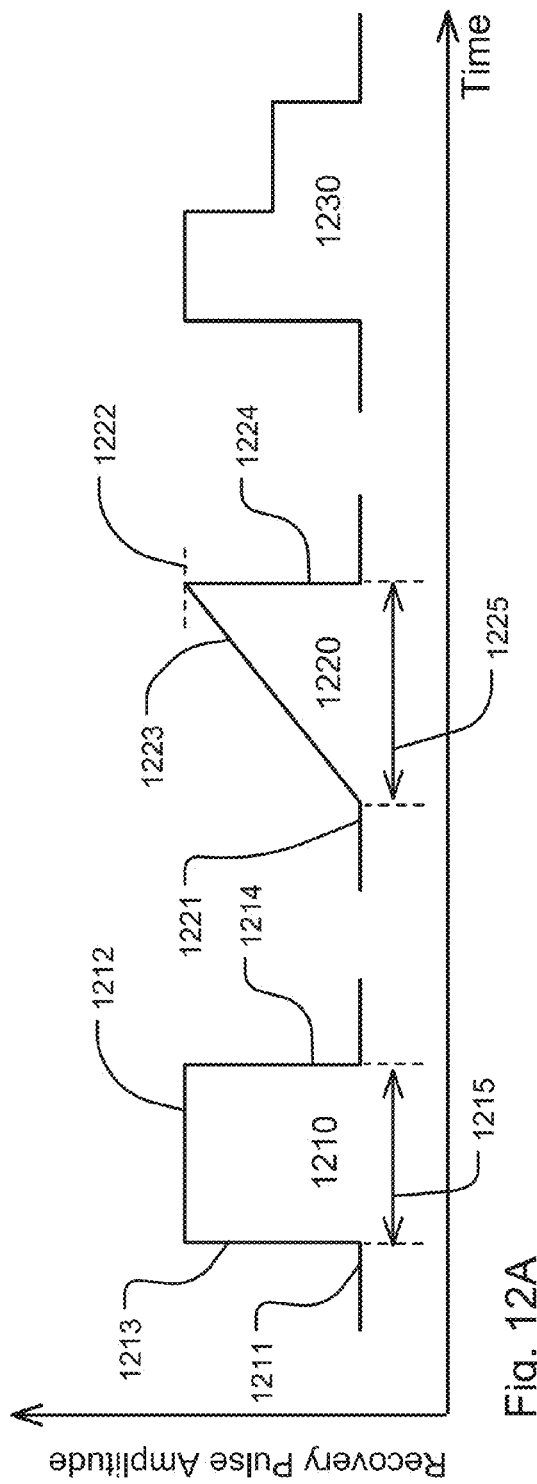
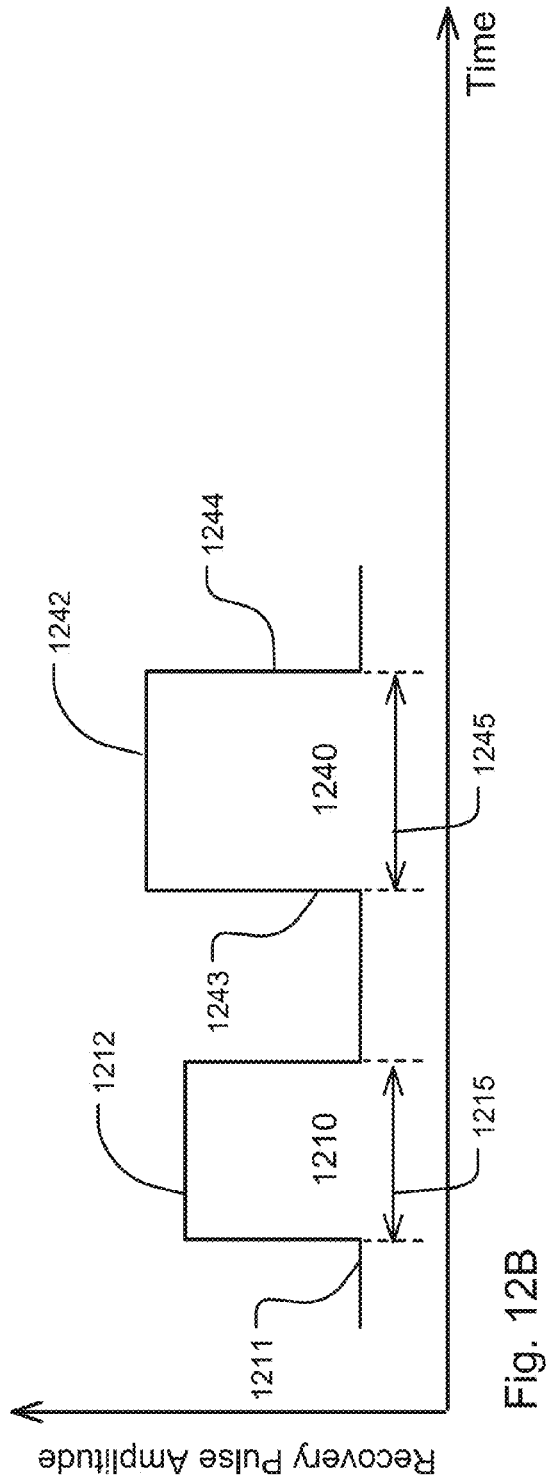
Fig. 12A
Fig. 12B

RESISTANCE DRIFT RECOVERY METHOD FOR MLC PCM

BACKGROUND

Field of the Technology

The present invention relates to high density memory devices based on programmable resistive memory materials, and methods for operating such devices.

Description of Related Art

In a phase change memory (PCM), each memory cell includes a phase change memory element. The phase change memory element is made of phase change materials that exhibit a large resistivity contrast between crystalline (lower resistivity) and amorphous (higher resistivity) phases. Phase change materials may include alloys of materials such as germanium (Ge), antimony (Sb), tellurium (Te), gallium (Ga), indium (In), silver (Ag), selenium (Se), thallium (Ti), bismuth (Bi), tin (Sn), copper (Cu), palladium (Pd), lead (Pb), sulfur (S), and gold (Au).

In operation of a phase change memory element, an electrical current pulse passed through the phase change memory cell can set or reset the resistivity phase of the phase change memory element. To reset the memory element into the amorphous phase, an electrical current pulse with a large amplitude for a short time period can be used to heat up an active region of the memory element to a melting temperature, and then cool quickly causing it to solidify in the amorphous phase. To set the memory element into the crystalline phase, an electrical current pulse with a medium amplitude, which causes it to heat up to a crystallization temperature, and a longer cooling time period can be used allowing the active region to solidify in a crystalline phase. To read the state of the memory element, a small voltage is applied to the selected cell and the resulting electrical current is sensed.

Resistance drift is a well-known phenomenon in PCM. The resistance of memory cells increases with time, and follows the power-law relationship:

$$R(t) = R_o \left(\frac{t}{t_o}\right)^\gamma$$

where $R_o$ is the initial resistance at an initial time $t_o$, $R(t)$ is the resistance at a time $t > t_o$, and $\gamma$ is a resistance drift coefficient.

To recover the resistance drift in PCM memory devices, one approach is to use a DRAM-like (dynamic random-access memory) refresh scheme to reprogram multiple states in MLC PCM memory cells. In DRAM memory cells, electrical charge stored in the storage capacitors gradually leaks out through the access transistor. Consequently, to maintain data integrity, data values stored in the DRAM memory cells must be periodically read out and restored to their respective full voltage levels before the stored electrical charges decay to indistinguishable levels. DRAM refresh requires different actions for different logical levels, and the number of actions required is equal to the number of logical levels.

However, using a DRAM-like refresh scheme to recover resistance drift in PCM memory devices can be time-consuming and endurance-wasting, especially for MLC PCM devices. For example, for a 256 Mb (mega-bit) PCM chip, the estimated refresh time for the entire chip can be calculated as:

$$\text{Refresh Time} = \frac{\text{(Chip Density)}}{(\text{\# Bit per Cell})(\text{\# Concurrent Writes})}(\text{\# of Program Iteration})$$

$$(\text{Program Latency}) = \left(\frac{256 \times 10^6}{2 \times 16}\right)(7.2)(200 \text{ ns}) = 11.5 \text{ sec}$$

where the verification time for programming MLC cells is omitted. Consequently the refresh time (e.g. 11.5 seconds) alone occupies about 13.4% of the total refresh interval which is set to the time to failure (e.g. 86 seconds).

Furthermore, using the DRAM-like refresh, endurance is wasted from periodic refreshes. For SLC (single level cell) memory cells, the total amount of endurance wasted in 10 years can be estimated as:

$$\text{SLC Endurance Wasted} =$$

$$\frac{(10 \text{ years})}{(\text{Refresh Interval})} = \frac{(10 * 365 * 24 * 60 * 60)}{(86)} = 3.67 \times 10^6 \text{ cycles} \approx 3.7\%,$$

assuming $10^8$ cycling endurance.

For MLC (multi-level cell) memory cells, the total amount of endurance wasted in 10 years can be estimated as:

MLC Endurance Wasted=(SLC Endurance Wasted)(# of MLC Program Iteration)=3.7%×7.2=26.6%, assuming $10^8$ endurance.

Another drawback for the DRAM-like refresh is that it cannot correct erroneous resistance levels of a memory cell. If a memory cell has drifted to an erroneous state, the DRAM-like refresh simply re-programs the memory cell to the erroneous state. Therefore, to be conservative, the refresh interval for the DRAM-like refresh needs to be shorter than the time to failure (e.g. 86 seconds), as described in connection with FIG. 1B, during which the first erroneous state can occur. Consequently, shorter refresh intervals will increase both the performance and endurance penalties.

It is desirable to provide MLC PCM devices that can recover resistance drift without the performance and endurance penalties caused by a DRAM-like refresh.

SUMMARY

The present technology describes a resistance drift recovery process for phase change memory with multiple level cells. The process reduces endurance, latency and power penalties as compared to a DRAM-like refresh scheme. The process does not require different recovery processes for respective resistance levels as required by a DRAM-like refresh scheme. As described herein, at least one of the recovery pulses applied to programmed memory cells can be independent of data values of the programmed memory cells.

A method is provided for operating a memory device including an array of memory cells including programmable resistive memory elements. Memory cells in the array are programmed to store data by applying program pulses to the memory cells to establish resistance levels within a number N of specified ranges of resistance, where each of the specified ranges corresponds to a particular data value. A drift recovery process is executed to the memory cells in the array, including applying a recovery pulse having a pulse shape to a set of programmed memory cells, where memory cells in the set of programmed memory cells, to which the recovery pulse having the pulse shape is applied, have resistance levels within two or more of the specified resistance ranges. The drift recovery process can be interrupted in response to an external command.

The N specified ranges include a higher resistance range in which the memory cells have active regions including a first volume of amorphous phase material, and a lower resistance range in which the memory cells have active regions including a second volume of amorphous phase material smaller than the first volume. The pulse shape is configured to cause a temperature above a melting point in active regions in memory cells in the higher resistance range, and to cause a temperature below the melting point in active regions in memory cells in the lower resistance range. The N specified ranges can include one or more intermediate resistance ranges in which the memory cells have active regions including volumes of amorphous phase material between the first volume and the second volume, where the one or more intermediate resistance ranges are between the higher resistance range and the lower resistance range. The number N can be greater than 2, and the memory cells in the set of programmed memory cells can have resistance levels in all N of the specified ranges.

The method can include applying a set of recovery pulses including the first-mentioned recovery pulse having the first-mentioned pulse shape and a second recovery pulse having a second pulse shape corresponding to the determined resistance level of the memory cell in the set to the memory cell. The first-mentioned pulse shape can be different than the second pulse shape, or the same as the second pulse shape.

The method can include reading memory cells in the set to determine resistance levels of the memory cells in the set, and applying recovery pulses having respective pulse shapes corresponding to the determined resistance levels to memory cells at the determined resistance levels in the set. The method can include reading memory cells in the set to determine resistance levels of the memory cells in the set, and applying recovery pulses having a same pulse shape to memory cells at two or more determined resistance levels in the set. The method can include applying recovery pulses having a same pulse shape to memory cells at multiple resistance levels in the set, without first reading memory cells in the set to determine resistance levels of the memory cells in the set.

A memory device in accordance with the method provided herein is also described.

Other aspects and advantages of the present technology can be seen on review of the drawings, the detailed description and the claims, which follow.

BRIEF DESCRIPTION OF THE DRAWINGS

FIGS. 2A, 2B, 2C, 2D and 2E illustrate two stages in resistance drift.

FIG. 6A illustrates a memory cell having a memory element including an active region including crystalline phase material.

FIG. 6B illustrates a temperature profile through the center of the memory element corresponding to FIG. 6A.

FIG. 7A illustrates a memory cell having a memory element including an active region including amorphous phase material.

FIG. 7B illustrates a temperature profile through the center of the memory element corresponding to FIG. 7A.

FIGS. 11A, 11B, 11C, 11D, 11E and 11F illustrate experimental results of a resistance drift recovery process corresponding to the time periods (1), (2), (3), (4), (5) and (6) shown in FIG. 10.

FIGS. 12A and 12B illustrate pulse shapes suitable for a recovery pulse applied in a resistance drift recovery process as described herein.

DETAILED DESCRIPTION

Figure 1B:
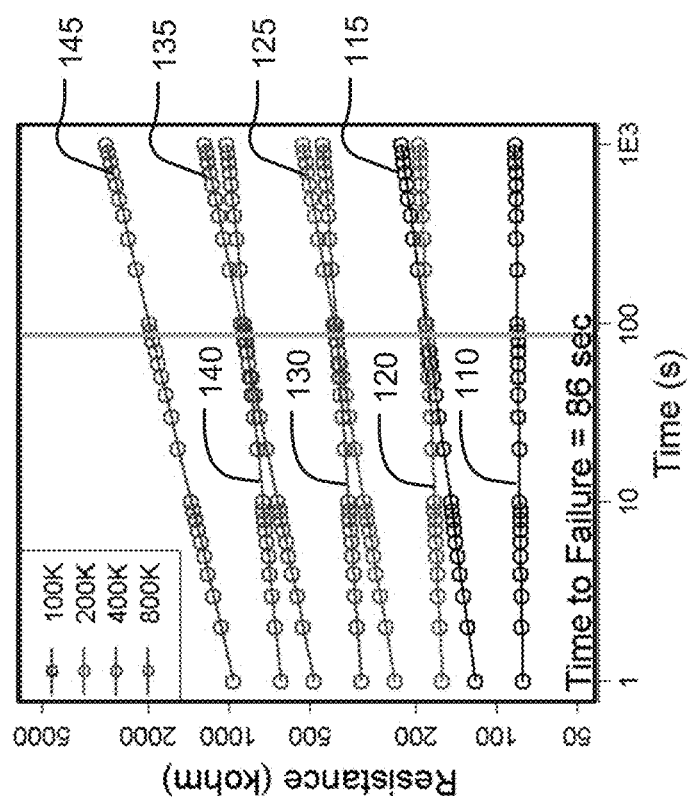
FIG. 1B illustrates resistance distributions for PCM cells after resistance drift over time.

A detailed description of embodiments of the present technology is provided with reference to the Figures. It is to be understood that there is no intention to limit the technology to the specifically disclosed structural embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

Figure 1A:
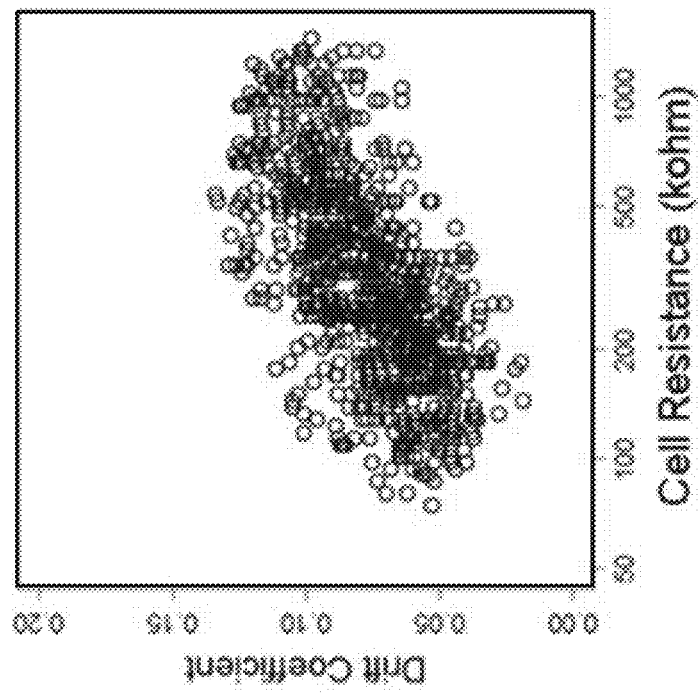
FIG. 1A illustrates resistance drift coefficients over a range of resistance values for MLC PCM memory cells.

FIG. 1A illustrates resistance drift coefficients over a range of resistance values for MLC (multi-level cell) PCM memory cells from experimental results. FIG. 1B illustrates resistance distributions for PCM cells after resistance drift over time for 4 resistance targets (e.g. 100 kohm, 200 kohm, 400 kohm, 800 kohm, where kohm stands for kilo-ohm). The resistance distribution for a resistance target (e.g. 100 kohm, 200 kohm, 400 kohm, 800 kohm) is within a lower limit (e.g. 110, 120, 130 and 140) and a higher limit (e.g. 115, 125, 135 and 145) over time, respectively. At time=1 second, a resistance margin of about 20% exists between adjacent resistance distributions. As the resistance of memory cells increases with time, each resistance distribution widens, and the resistance margin decreases between adjacent resistance distributions.

Each resistance distribution represents a logical level for MLC (multi-level cell) PCM (phase change memory) cells. A dynamic reference can be used to distinguish between two resistance distributions representing two logical levels for MLC (multi-level cell) PCM (phase change memory) cells, if the resistance margin is wide enough. The difficulty of placing a dynamic reference between two resistance distributions of memory cells over the life cycle of the memory cells increases with wider resistance distributions, as the resistance margin between two resistance distributions decreases over the life cycle of the memory cells. As shown in the example of FIG. 1B, at time to failure=86 seconds, the lower limit 140 of the resistance distribution for the resistance target 800 kohm overlaps the higher limit 135 of the resistance distribution for the resistance target 400 kohm. Consequently, it is not possible to distinguish the logical levels represented by the resistance distributions for the resistance targets of 800 kohm and 400 kohm.

Likewise, at the time to failure, the lower limit 130 of the resistance distribution for the resistance target 400 kohm overlaps the higher limit 125 of the resistance distribution for the resistance target 200 kohm. Consequently, it is not possible to distinguish the logical levels represented by the resistance distributions for the resistance targets of 400 kohm and 200 kohm. At the time to failure, the lower limit 120 of the resistance distribution for the resistance target 200 kohm overlaps the higher limit 115 of the resistance distribution for the resistance target 100 kohm. Consequently, it is not possible to distinguish the logical levels represented by the resistance distributions for the resistance targets of 200 kohm and 100 kohm.

FIGS. 2A, 2B, 2C, 2D and 2E illustrate two stages in resistance drift. The vertical axis indicates the ratio of $R(t)/R_0$, where $R_0$ is the initial resistance at an initial time $t_0$, and $R(t)$ is the resistance at a time $t>t_0$. The horizontal axis indicates the time over which the resistance has drifted, in log scale. FIGS. 2A, 2B, 2C, 2D and 2E illustrate data measured and calculated for the set state at annealing temperatures of 85° C., 125° C., 150° C., 180° C. and 200° C.

As illustrated in the figures, the resistance drift includes a drift stage and a decay stage that follows the drift stage. Maximum resistance $R_{max}$ and corresponding time $t_{max}$ are shown at the transition between the drift stage and the decay stage. As illustrated in FIGS. 2A and 2B, at relatively low temperatures (e.g. 85° C. and 125° C.), the resistance drift is dominated by the drift stage. For instance, as illustrated in FIG. 2A, at 85° C., the resistance drift is dominated by the drift stage. As illustrated in FIG. 2B, at 125° C., the decay stage starts at about time=$10^{6.7}$ seconds.

As illustrated in FIGS. 2C and 2D, at intermediate temperatures (e.g. 150° C. and 180° C.), the drift stage ends and the decay stage starts at time $t_{max}$, and the maximum resistance $R_{max}$ occurs at $t_{max}$. As the temperature increases, $t_{max}$ becomes shorter. For instance, as illustrated in FIG. 2C, at 150° C., the drift stage ends and the decay stage starts after about time=$10^{5.3}$ seconds. As illustrated in FIG. 2D, at 180° C., the drift stage ends and the decay stage starts after about time=$10^{3.8}$ seconds. As illustrated in FIG. 2E, at 200° C., the drift stage ends and the decay stage starts after about time=$10^{3.2}$ seconds, and consequently, the decay stage dominates the resistance drift.

Figure 3:
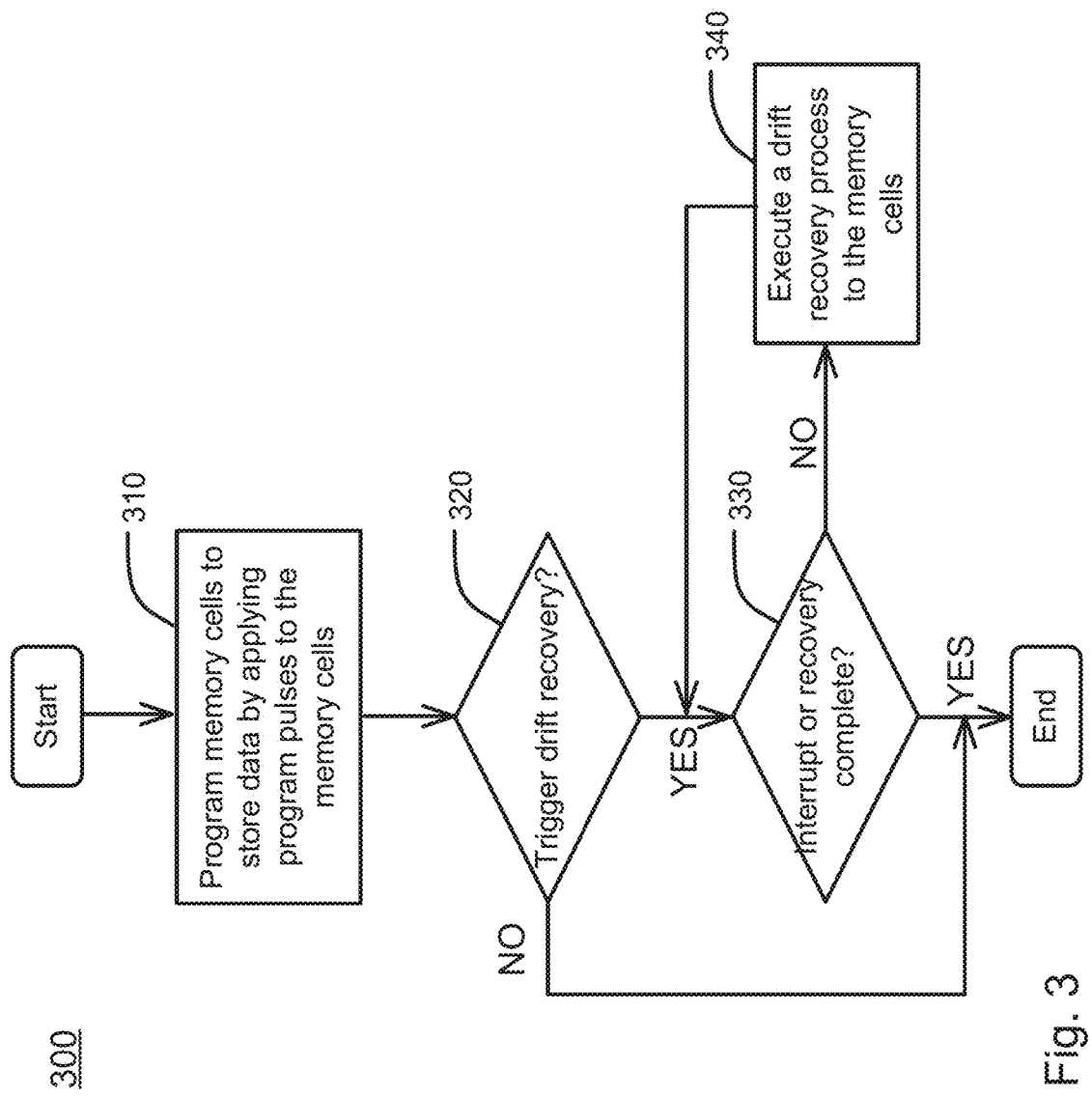
FIG. 3 shows an example flowchart for applying resistance drift recovery to one or more groups of memory cells in an array of memory cells.

FIG. 3 shows an example flowchart 300 for applying resistance drift recovery to one or more groups of memory cells in an array of memory cells in a memory device. The array can include blocks of memory cells, each of the blocks can include pages of memory cells, and each page in a block can include multiple memory cells. A group of memory cells as used herein can refer to a block of memory cells, multiple blocks of memory cells, a page of memory cells in a block, multiple pages of memory cells in a block, multiple pages of memory cells in two or more blocks, or combinations thereof.

At Step 310, memory cells in the array are programmed to store data by applying program pulses to the memory cells to establish resistance levels within a number N of specified ranges of resistance, where each of the specified ranges corresponds to a particular data value. The N specified ranges include a higher resistance range in which the memory cells have active regions including a first volume of amorphous phase material, and a lower resistance range in which the memory cells have active regions including a second volume of amorphous phase material smaller than the first volume.

The N specified ranges can include one or more intermediate resistance ranges in which the memory cells have active regions including volumes of amorphous phase material between the first volume and the second volume, where the one or more intermediate resistance ranges are between the higher resistance range and the lower resistance range. The number N can be greater than 2, and the memory cells in the set of programmed memory cells can have resistance levels in all N of the specified ranges.

At Step 320, it is determined whether to trigger resistance drift recovery on one or more groups of memory cells. Resistance drift recovery can be triggered periodically, for example, on periods of 50 seconds, or in response to an event. For example, an event can be when the memory device switches from a standby mode to an active mode, when errors are detected by an ECC (error correcting code) scheme, or when a specified drift resistance threshold is reached by at least some of the memory cells in the array.

When such an event occurs, resistance drift recovery can be immediate, or can be scheduled to a later time if there are more urgent tasks to be run on the memory device, as determined by a system that controls the memory device. When resistance drift recovery needs to be executed on multiple groups of memory cells, the system can prioritize the order in which to execute resistance drift recovery based on data urgency, e.g. which group of memory cells is worn out more than other groups and therefore needs resistance drift recovery first. The system can also prioritize the order in which to execute resistance drift recovery based on which group of memory cells holds data more important than other groups of memory cells. For example, boot code is typically accessed first when a system is powered up, and accordingly priority for resistance drift recovery may be given to the boot code.

If it is determined to trigger resistance drift recovery on one or more groups of memory cells, then at Step 330, it is determined whether an interrupt or suspend command has been received from a source external to the memory device. If an interrupt or suspend command has been received, the resistance drift recovery stops, and can be resumed later when the resistance drift recovery is triggered again.

If an interrupt or suspend command has not been received, then at Step 340, a resistance drift recovery process can be executed on the memory cells in the array. The drift recovery process includes applying a recovery pulse having a pulse shape to a set of programmed memory cells, where memory cells in the set of programmed memory cells, to which the recovery pulse having the pulse shape is applied, have resistance levels within two or more of the specified resistance ranges. The pulse shape of a recovery pulse is configured to cause a temperature above a melting point in active regions in memory cells in the higher resistance range, as further described in connection to FIGS. 7A, 7B and 7C, and to cause a temperature below the melting point in active regions in memory cells in the lower resistance range, as further described in connection to FIGS. 6A, 6B and 6C. The pulse shape is further described in connection with FIGS. 12A and 12B. The drift recovery process is further described in connection with FIG. 4 and FIG. 5.

After the resistance drift recovery process is executed on one group of memory cells, the resistance drift recovery process can be executed on more groups of memory cells, until an interrupt or suspend command is received from a source external to the memory device or until the resistance drift recovery process is completed on the one or more groups of memory cells.

Figure 4:
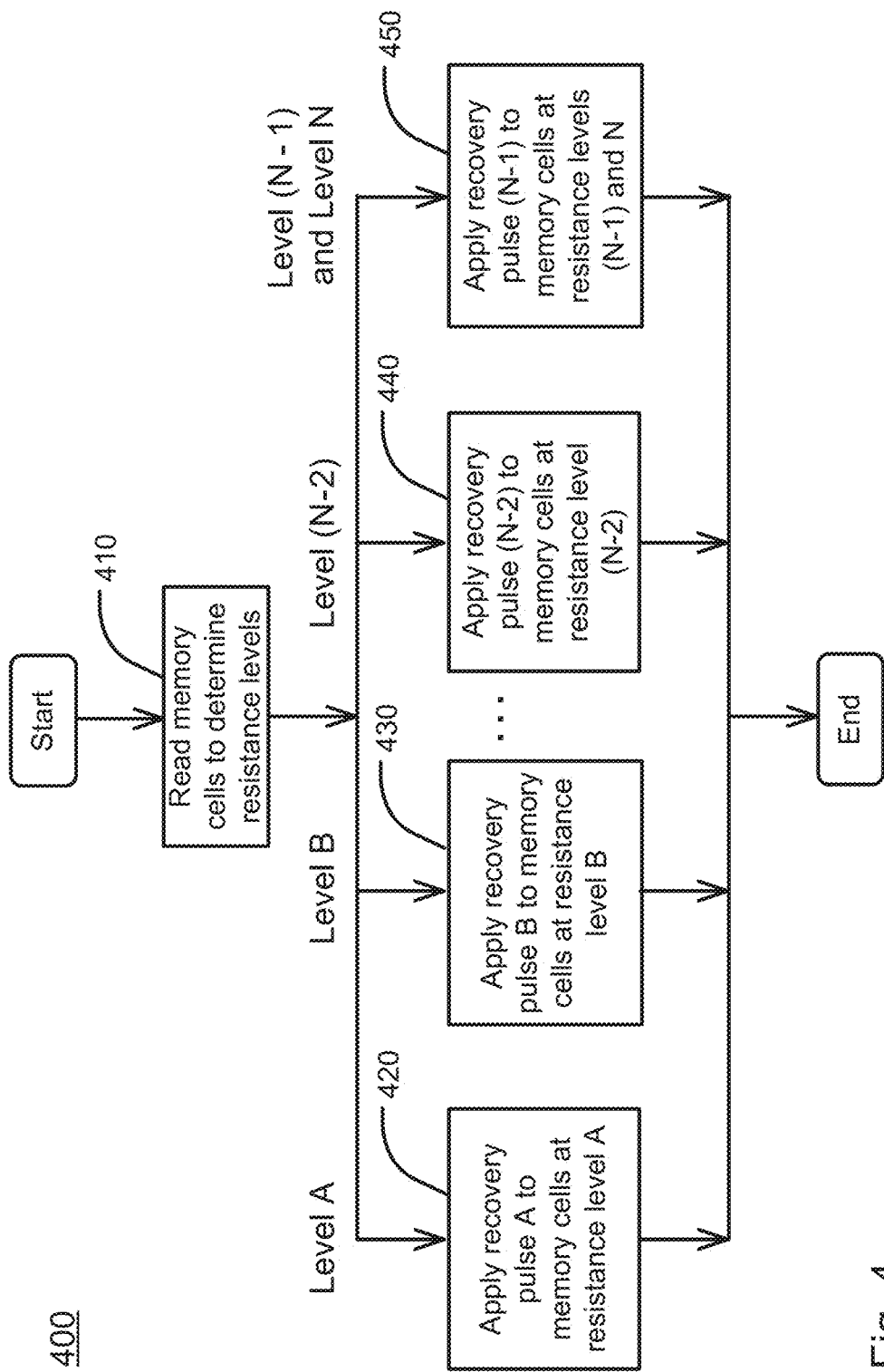
FIG. 4 shows an example flowchart for executing a resistance drift recovery process to a group of memory cells in an array of memory cells, using recovery pulses having different pulse shapes.
Figure 8:
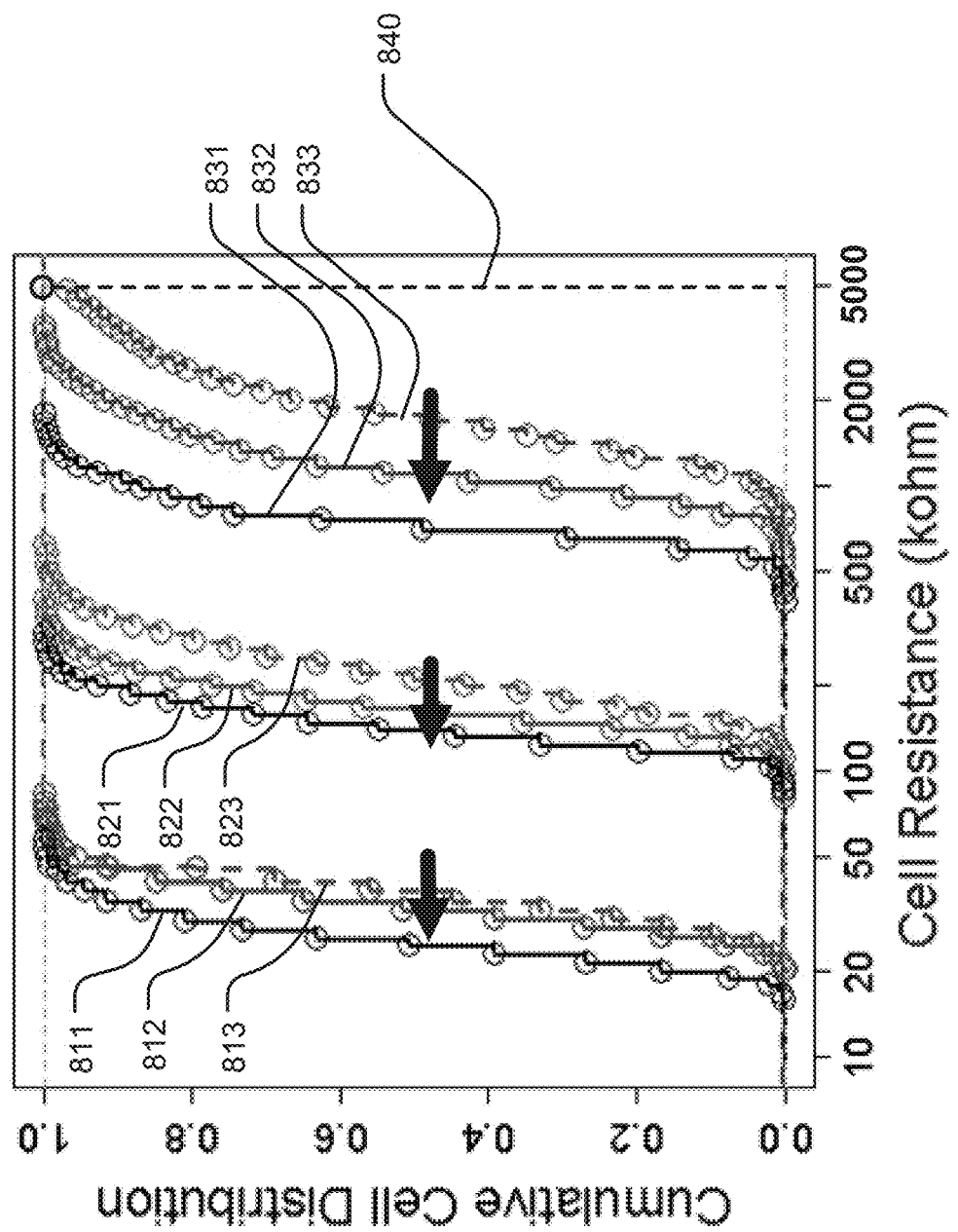
FIG. 8 illustrates experimental results of a resistance drift recovery process using an example recovery pulse.

FIG. 4 shows an example flowchart 400 for executing a resistance drift recovery process to a group of memory cells in an array of memory cells, corresponding to block 340 in FIG. 3. At Step 410, memory cells in a set of programmed memory cells is read to determine resistance levels of the memory cells in the set. For instance, the determined resistance levels can be within the before-recovery ranges of resistance (e.g. 813, 823, 833), or beyond an upper limit (e.g. 5000-kohm) of the sensing range (e.g. 840), as shown in FIG. 8.

At Steps 420-450, recovery pulses having respective pulse shapes corresponding to the determined resistance levels are applied to memory cells at the determined resistance levels in the set. For instance, recovery pulses A, B and (N−2) can be applied to memory cells at determined resistance levels A, Level B and Level (N−2), respectively. Recovery pulse (N−1) can be applied to memory cells at determined resistance levels (N−1) and N.

The pulse shapes of the recovery pulses can vary in current amplitude and time duration corresponding to the determined resistance levels. For instance, recovery pulses A, B, (N−2) and (N−1) can have pulse shapes 50 uA-30 ns, 80 uA-30 ns, 80 uA-50 ns and 100 uA-50 ns, where uA stands for microampere and ns stands for nanosecond. The pulse shapes of the recovery pulses are further described in connection with FIGS. 12A and 12B.

Recovery pulses having a same pulse shape can be applied to memory cells at two or more determined resistance levels in the set. For instance, as shown in FIG. 4, recovery pulses having a same pulse shape (e.g. recovery pulse (N−1)) can be applied to memory cells at determined resistance levels Level (N−1) and level N. For instance (not shown in FIG. 4), recovery pulses having a same pulse shape (e.g. recovery pulse B) can be applied to memory cells at determined resistance levels Level A and Level B. For instance (not shown in FIG. 4), recovery pulses having a same pulse shape (e.g. recovery pulse B) can be applied to memory cells at determined resistance levels Level A, Level B and Level (N−1). Consequently the number of different pulse shapes in recovery pulses applied to a set of programmed memory cells can be fewer than the number of resistance levels at which the memory cells are programmed.

Figure 5:
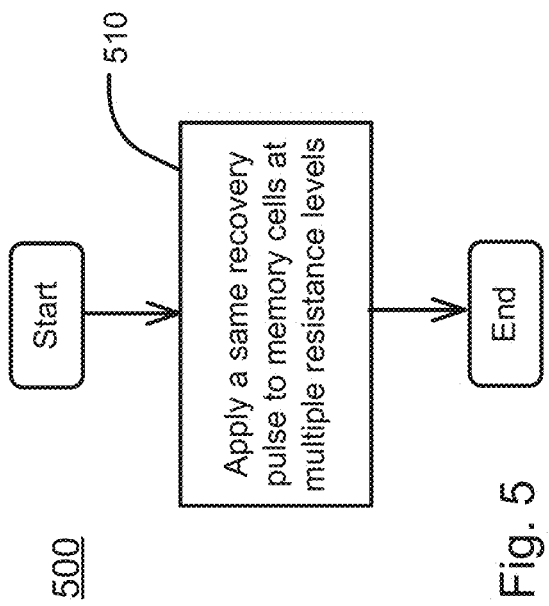
FIG. 5 shows an example flowchart for executing a resistance drift recovery process to a group of memory cells in an array of memory cells, using recovery pulses having a same pulse shape.

FIG. 5 shows an example flowchart 500 for executing a resistance drift recovery process to a group of memory cells in an array of memory cells, corresponding to block 340 in FIG. 3. At Step 510, recovery pulses having a same pulse shape, such as 80 uA-50 ns, can be applied to memory cells at multiple resistance levels in the set of programmed memory cells, without first reading memory cells in the set to determine resistance levels of the memory cells in the set. Consequently, at least one of the recovery pulses applied to programmed memory cells can be independent of data values of the programmed memory cells, where the data values are represented by the resistance levels of the programmed memory cells. Experimental results of a resistance drift recovery process where recovery pulses having a same pulse shape are applied to memory cells at multiple resistance levels are described in connection with FIGS. 8, 9,10, 11A, 11B, 11C, 11D, 11E and 11F.

Table 1 below shows the thermal conductivity difference between amorphous and crystalline GST (GeSbTe), from Ciocchini, N.; Palumbo, E.; Borghi, M.; Zuliani, P.; Annunziata, R.; Ielmini, D., "Modeling Resistance Instabilities of Set and Reset States in Phase Change Memory With Ge-Rich GeSbTe," Electron Devices, IEEE Transactions on, vol. 61, no. 6, pp. 2136, 2144, June 2014.

TABLE 1

Thermal Conductivity and Thermal Interface Resistance for Silicon Dioxide, Silicon Nitride, and $Ge_2Sb_2Te_5$ Chalcogenide in the Amorphous, fcc and, hcp Phases

| | thermal conductivity [W · mK$^{-1}$] | thermal interface resistance [m$^2$K · W$^{-1}$] |
|---|---|---|
| SiO$_2$ | 1.46 | 20 · 10$^{-9}$ |
| Si$_3$N$_4$ | 1.45 ± 0.03 | (40 ± 2) · 10$^{-9}$ |
| amorphous GST | 0.21 ± 0.02 | (94 ± 37) · 10$^{-9}$ |
| fcc GST | 0.55 ± 0.03 | (72 ± 20) · 10$^{-9}$ |
| hcp GST | 1.13 ± 0.11 | (159 ± 11) · 10$^{-9}$ | where face-centered cubic (fcc) crystalline phase and hexagonally close-packed (hcp) crystalline phase have greater thermal conductivity than the amorphous GST.

The lower thermal conductivity of amorphous GST helps in trapping more heat and increase cell temperature. This allows a weaker program pulse (e.g. 80 uA/30 ns) to melt a portion of the amorphous region, achieving resistance drift recovery in the amorphous region. On the other hand, for a crystalline GST cell, the higher thermal conductivity allows the heat to dissipate through a larger volume, not making the cell temperature high enough to reach the critical melting point.

FIG. 6A illustrates a memory cell having a memory element including an active region including crystalline phase material. The memory element can include GST (GeSbTe) materials, for example. The memory cell has a first electrode 611 extending through dielectric 612, a memory element 613 including crystalline phase material, and a second electrode 614 on the memory element 613. For example, the memory element 613 can have a height of 100 nm (nanometer) and a width of 100 nm. The first electrode 611 is coupled to a terminal of an access device (not shown) such as a diode or transistor, while the second electrode 614 is coupled to a bit line and can be part of the bit line (not shown). The first electrode 611 can have a width less than the width of the second electrode 614 and memory element 613, establishing a small contact area between the body of phase change material and the first electrode 611 and a relatively larger contact area between the body of phase change material and the second electrode 614, so that higher current densities are achieved with small absolute current values through the memory element 613. Because of this smaller contact area at the first electrode 611, the current density is largest in operation in the region adjacent the first electrode 611, resulting in the active region 615 having a "mushroom" shape as shown in FIG. 6A. The smaller contact area can be referred to as a heater (e.g. 620) because of the higher temperature achieved from the higher current densities through the smaller contact area. For example, the heater can have a height of about 10 nm.

In this example, a recovery pulse having a pulse shape of 80 uA-30 ns is applied to the memory cell having a memory element including an active region including crystalline phase material.

FIG. 6B illustrates a temperature profile 640 through the center of the memory element 613, including through the center of the active region 615 including crystalline phase material, as indicated by the dotted line 630. The temperature profile 640 is based on thermal simulation of the memory cell including the memory element 613. As illustrated in FIG. 6B, the temperature stays at about 300° K in the heater 620 for the first 10 nm in vertical distance in the memory element 613, rises to about 500° K at about 40 nm in vertical distance in the memory element 613, and falls back to about 300° K at about 100 nm in vertical distance in the memory element 613. Since the melting point 650 is about 600° K, the recovery pulse having a pulse shape of 80 uA-30 ns is a weak pulse that is not enough to raise the temperature of the active region including crystalline phase material above the melting point 650.

Figure 6C:
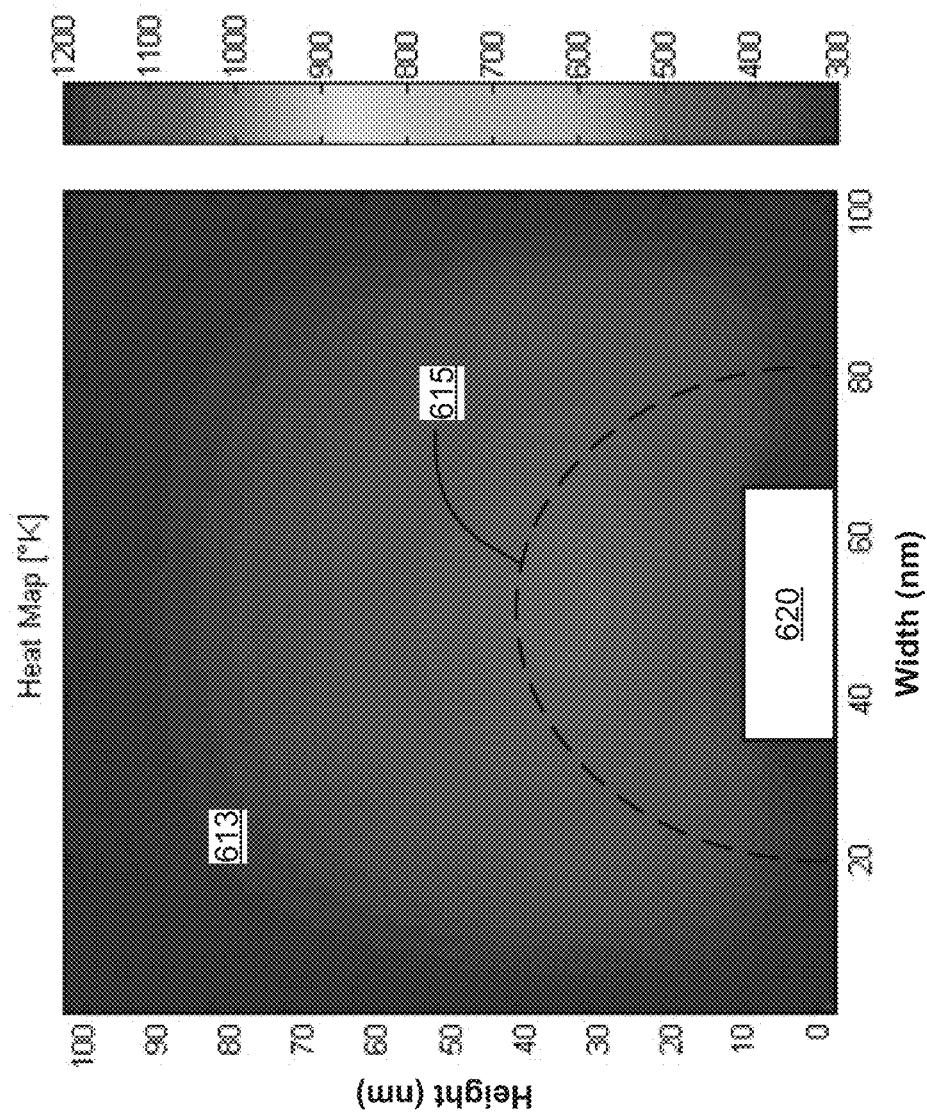
FIG. 6C is a heat map of the memory element corresponding to FIGS. 6A and 6B.

FIG. 6C is a heat map of the memory element corresponding to FIGS. 6A and 6B. As illustrated in FIG. 6C, the temperature of the active region including crystalline phase material in the memory element reaches about 500° K, below the melting point of 600° K, between about 30 nm and 40 nm in vertical distance along the height, and between about 45 nm and 60 nm in horizontal distance along the width.

FIG. 7A illustrates a memory cell having a memory element including an active region including amorphous phase material. Like elements in FIG. 7A are referred to with like reference numerals in FIG. 6A. Description about the memory cell in connection to FIG. 6A is generally applicable to FIG. 7A.

In this example, a recovery pulse having a pulse shape of 80 uA-30 ns is applied to the memory cell having a memory element including an active region including amorphous phase material. The pulse shape of 80 uA-30 ns is the same as the recovery pulse applied to the memory cell including an active region including crystalline phase material, as described in connection with FIG. 6A.

FIG. 7B illustrates a temperature profile 740 through the center of the memory element 613, including through the center of the active region including amorphous phase material (e.g. 715), as indicated by the dotted line 630. The temperature profile 740 is based on thermal simulation of the memory cell including the memory element 613. As illustrated in FIG. 7B, the temperature stays at about 300° K in the heater 620 for the first 10 nm in vertical distance in the memory element 613, rises to about 700° K at about 20 nm in vertical distance in the memory element 613, and falls back to about 300° K at about 100 nm in vertical distance in the memory element 613.

Since the melting point 650 is about 600° K, the recovery pulse having a pulse shape of 80 uA-30 ns raises the temperature of the active region including amorphous phase material above the melting point between about 15 nm and 25 nm in vertical distance along the height. In comparison, the recovery pulse having a pulse shape of 80 uA-30 ns is not enough to raise the temperature of the active region including crystalline phase material above the melting point 650.

Figure 7C:
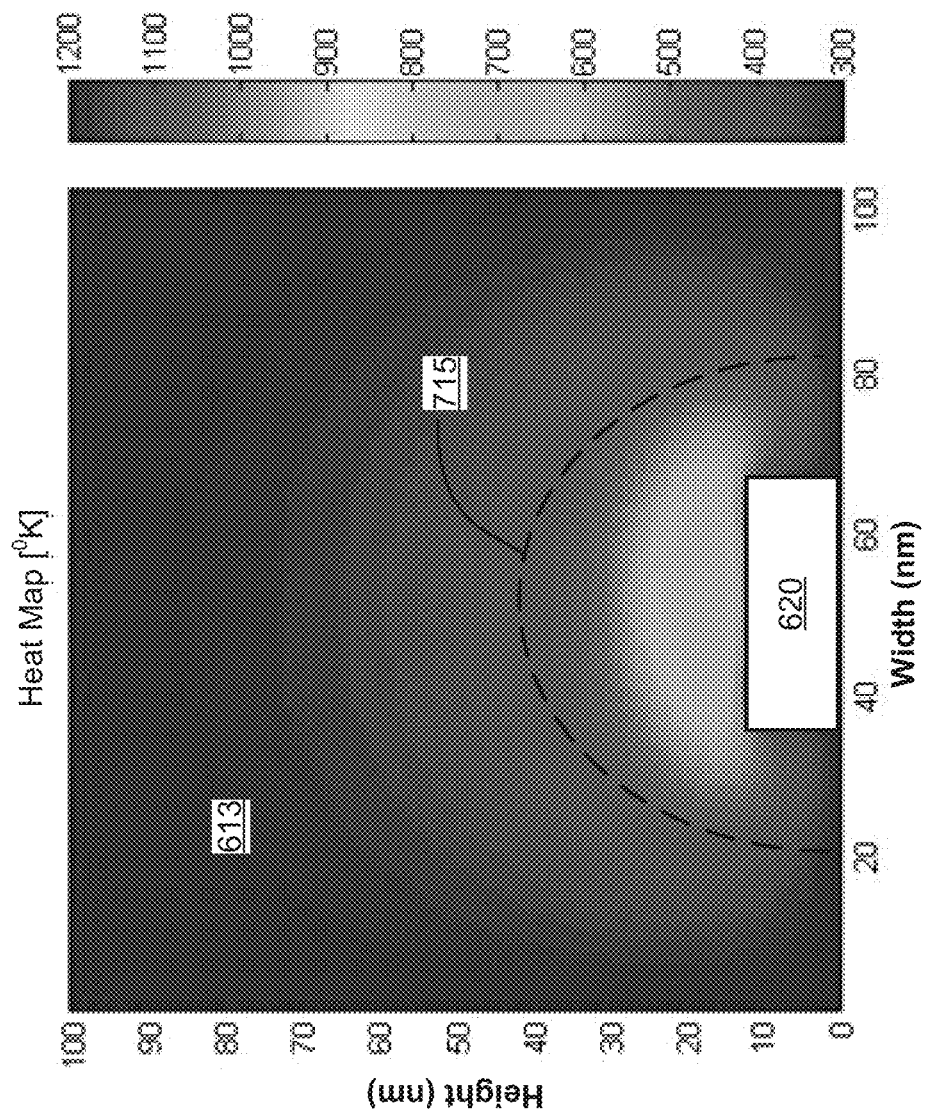
FIG. 7C is a heat map of the memory element corresponding to FIGS. 7A and 7B.

FIG. 7C is a heat map of the memory element corresponding to FIGS. 7A and 7B. As illustrated in FIG. 7C, the temperature of the active region including amorphous phase material in the memory element is above the melting point between about 15 nm and 25 nm in vertical distance along the height, and between 35 nm and 65 nm in horizontal distance along the width.

FIG. 8 illustrates experimental results of a resistance drift recovery process using an example recovery pulse having a pulse shape of 80 uA-30 ns. Three sets of resistance ranges are shown, where each set includes an initial range, a before-recovery range, and an after-recovery range. For instance, the time between the initial range and the before-recovery range is 3 days. Arrows for the three sets indicate movement of resistance ranges caused by the resistance drift recovery process. In each set, the after-recovery range (e.g. 812, 822 and 832) is closer to the initial range (e.g. 811, 821 and 831) than the before-recovery range (e.g. 813, 823 and 833). A fourth set of resistance ranges is shown as a vertical line (e.g. 840) at an upper limit (e.g. 5000-kohm) of the sensing range, because resistance ranges in the fourth set are beyond the upper limit of the sensing range of the memory device. Each of the four sets of resistance ranges corresponds to a particular data value of MLC (multi-level cell) memory cells. For example, 4-level memory cells can include data values of 00, 01, 11 and 10.

Figure 9:
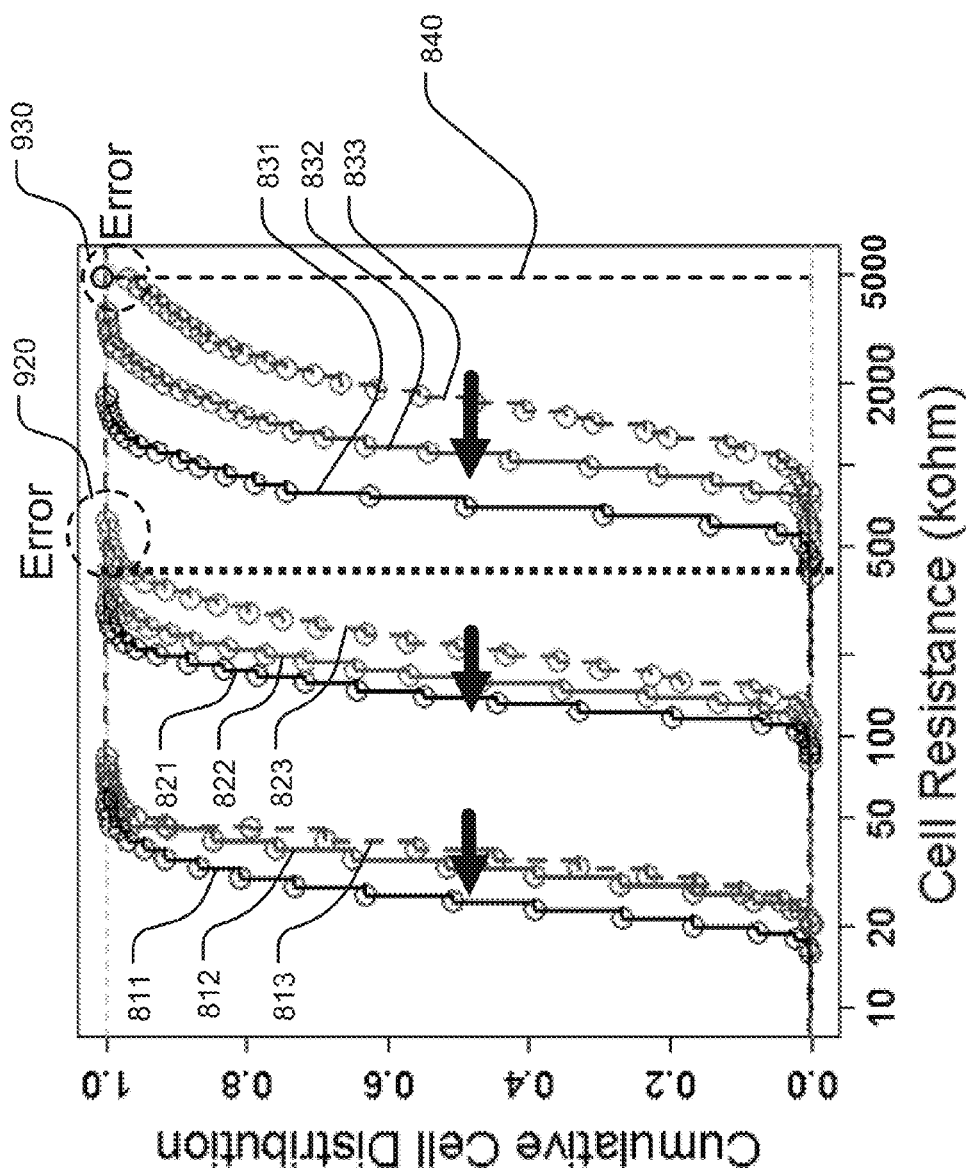
FIG. 9 shows that erroneous resistance levels of memory cells can be corrected with a resistance drift recovery process.

FIG. 9 shows that erroneous resistance levels of memory cells can be corrected with a resistance drift recovery process, using an example recovery pulse having a pulse shape of 80 uA-30 ns. Like elements in FIG. 9 are referred to with like reference numerals in FIG. 8.

As illustrated in the example of FIG. 9, erroneous resistance levels occur where the before-recovery range (e.g. 823) in the second set of resistance ranges overlap the third set of resistance ranges (e.g. 831, 832, 833), as indicated by circle 920, and that those erroneous resistance levels are corrected in the after-recovery range (e.g. 822) in the second set of resistance ranges, such that the after-recovery range (e.g. 822) in the second set of resistance ranges does not overlap the third set of resistance ranges.

Erroneous resistance levels occur where the before-recovery range (e.g. 833) in the third set of resistance ranges is at least partially beyond the upper limit of the sensing range, as indicated by circle 930, and that those erroneous resistance levels are corrected in the after-recovery range (e.g. 832) in the third set of resistance ranges, such that the after-recovery range (e.g. 832) in the third set of resistance ranges is below the upper limit of the sensing range.

In contrast, with a DRAM-like refresh scheme, the erroneous resistance levels will be re-programmed to the same erroneous resistance levels, instead of being corrected.

Figure 10:
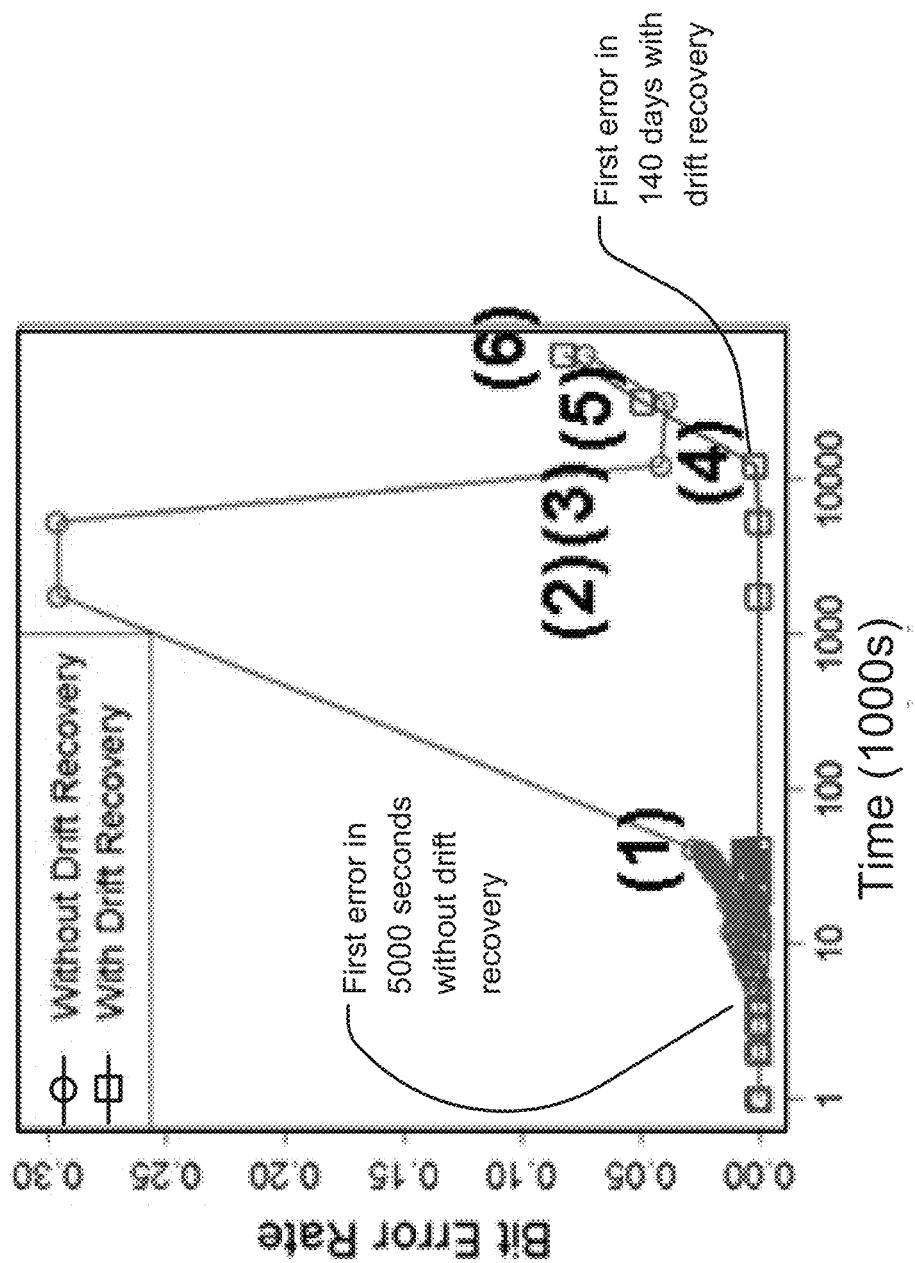
FIG. 10 shows first errors in experimental data for without and with a resistance drift recovery process as described herein.

FIG. 10 shows first errors in experimental data for without and with a resistance drift recovery process as described herein, using an example recovery pulse having a pulse shape of 80 uA-30 ns. The first error occurs in 5000 seconds without a resistance drift recovery process. In comparison, the first error occurs in 140 days with the resistance drift recovery process, resulting in 2400 times improvement. Resistance ranges for time periods (1), (2), (3), (4), (5) and (6) are shown in FIGS. 11A, 11B, 11C, 11D, 11E and 11F respectively.

FIGS. 11A, 11B, 11C, 11D, 11E and 11F illustrate experimental results of a resistance drift recovery process corresponding to the time periods (1), (2), (3), (4), (5) and (6) shown in FIG. 10, using an example recovery pulse having a pulse shape of 80 uA-30 ns. The time periods (1), (2), (3), (4), (5) and (6) correspond to approximately 30, 1,600, 7,000, 16,000, 30,000, and 60,000 thousand seconds, respectively.

Three sets of resistance ranges are shown in FIG. 11A, where each set includes an initial range, a before-recovery range, and an after-recovery range. The first set of resistance ranges in the three sets corresponds to a lower resistance range, including an initial range 1111 corresponding to cell resistance between about 10-kohm and 20-kohm shown in the upper and lower graphs of FIG. 11A, a before-recovery range 1113 shown in the lower graph, and an after-recovery range 1112 shown in the upper graph.

Likewise, the second set of resistance ranges in the three sets corresponds to an intermediate resistance range, including an initial range 1121 corresponding to cell resistance between about 50-kohm and 200-kohm in the upper and lower graphs of FIG. 11A, a before-recovery range 1123 shown in the lower graph, and an after-recovery range 1122 shown in the upper graph. The third set of resistance ranges in the three sets corresponds to an upper resistance range, including an initial range 1131 corresponding to cell resistance between about 500-kohm and 2000-kohm in the upper and lower graphs of FIG. 11A, a before-recovery range 1133A shown in the lower graph, and an after-recovery range 1132A shown in the upper graph.

In general, movement of resistance ranges caused by the resistance drift recovery process such that the after-recovery range is moved towards the initial range relative to the before-recovery range. The first set of resistance ranges exhibits less movement than the second set of resistance ranges, and the third set of resistance ranges. A fourth set of resistance ranges is shown as a vertical line (e.g. 1140) at an upper limit (e.g. 5000-kohm) of the sensing range, because resistance ranges in the fourth set are beyond the upper limit of the sensing range of the memory device.

As shown in the lower graph in FIG. 11A, erroneous resistance levels can occur where the before-recovery range in the third set of resistance ranges (e.g. 1133A) is at least partially beyond the upper limit of the sensing range, as indicated by the circle 1150A. As shown in the upper graphs in FIG. 11A, those erroneous resistance levels are corrected in the after-recovery range in the third set of resistance ranges, such that the after-recovery range in the third set of resistance ranges (e.g. 1132A) is below the upper limit of the sensing range.

Likewise, as shown in the lower graph in FIG. 11B, erroneous resistance levels can occur where the before-recovery range in the third set of resistance ranges (e.g. 1133B) is at least partially beyond the upper limit of the sensing range, as indicated by the circle 1150B. As shown in the upper graph in FIG. 11B, those erroneous resistance levels are corrected in the after-recovery range in the third set of resistance ranges, such that the after-recovery range in the third set of resistance ranges (e.g. 1132B) is below the upper limit of the sensing range.

As shown in the lower graph in FIG. 11C, erroneous resistance levels can occur where the before-recovery range in the third set of resistance ranges (e.g. 1133C) is at least partially beyond the upper limit of the sensing range, as indicated by the circle 1150C. As shown in the upper graph in FIG. 11C, those erroneous resistance levels are corrected in the after-recovery range in the third set of resistance ranges, such that the after-recovery range in the third set of resistance ranges (e.g. 1132C) is below the upper limit of the sensing range.

As shown in the lower graph in FIG. 11D, erroneous resistance levels can occur where the before-recovery range in the third set of resistance ranges (e.g. 1133D) is at least partially beyond the upper limit of the sensing range, as indicated by the circle 1150D. As shown in the upper graph in FIG. 11D, those erroneous resistance levels are corrected in the after-recovery range in the third set of resistance ranges, such that the after-recovery range in the third set of resistance ranges (e.g. 1132D) is below the upper limit of the sensing range.

As shown in the lower graphs in FIGS. 11E and 11F for time periods (5) and (6) that are beyond 140 days, erroneous resistance levels can occur where the before-recovery range in the fourth set of resistance ranges (e.g. 1143E and 1143F) is at least partially beyond the upper limit of the sensing range, as indicated by circles 1150E and 1150F. Erroneous resistance levels can also occur where the before-recovery range in the fourth set of resistance ranges (e.g. 1143E and 1143F) is at least partially within the sensing range but overlaps the third set of resistance ranges, because of the decay stage in the resistance drift as described in connection with FIGS. 2A, 2B, 2C, 2D and 2F. As shown in the upper graphs in FIGS. 11E and 11F, the erroneous resistance levels are not corrected for time periods (5) and (6) that are beyond 140 days.

Consequently, FIGS. 11A, 11B, 11C, 11D, 11E and 11F illustrate that, by using the resistance drift recovery process as described herein, the first error occurs in 140 days, resulting in 2400 times improvement, as compared to the first error occurrence in 5000 seconds without using the resistance drift recovery process as described herein.

FIGS. 12A and 12B illustrate pulse shapes suitable for a recovery pulse applied in a resistance drift recovery process as described herein. For instance, the pulse shapes can include a rectangular pulse shape (e.g. 1210), a ramp-up pulse shape (e.g. 1220), and an L-shaped pulse shape (e.g. 1230), as shown in FIG. 12A. The pulse shapes can be defined by parameters including an amplitude in voltage, current, power or temperature, and a time duration.

A rectangular pulse shape (e.g. 1210) can transition from a low amplitude (e.g. 1211) to a high amplitude (e.g. 1212) on a rising edge (e.g. 1213), transition from the high amplitude to the low amplitude on a falling edge (e.g. 1214), and have a time duration (e.g. 1215) between the rising edge and the falling edge. For instance, a rectangular pulse shape can vary in current amplitude and time duration: 50 uA-30 ns, 80 uA-30 ns, 80 uA-50 ns, and 100 uA-50 ns, where uA stands for microampere and ns stands for nanosecond. In implementations, recovery pulses with different pulse shapes can be applied to memory cells at different determined resistance levels.

A triangular pulse shape (e.g. 1220) can transition from a low amplitude (e.g 1221) to a high amplitude (e.g. 1222) on a rising slope (e.g. 1223), and then transition from the high amplitude to the low amplitude on a falling edge (e.g. 1224). A time duration of a triangular pulse shape (e.g. 1225) can include a rise time of the rising slope, and a fall time of the falling edge. The rise time can be substantially longer than the fall time, and can include at least 50% of the triangular pulse.

As shown in the example of FIG. 12B, in a resistance drift recovery process, a set of recovery pulses including the first-mentioned recovery pulse having the first-mentioned pulse shape (e.g. 1210) and a second recovery pulse having a second pulse shape corresponding to the determined resistance level of the memory cell in the set can be applied to the memory cell. The first-mentioned pulse shape can be different than or the same as the second pulse shape, in amplitude and/or time duration.

For instance, the first pulse shape (e.g. 1210) can be as described in connection with FIG. 12A, and the second pulse shape (e.g. 1240) can be a rectangular pulse shape. The second pulse shape (e.g. 1240) can transition from a low amplitude (e.g. 1211) to a high amplitude (e.g. 1242) on a rising edge (e.g. 1243), transition from the high amplitude to the low amplitude on a falling edge (e.g. 1244), and have a time duration (e.g. 1245) between the rising edge and the falling edge.

For instance, the first pulse shape and the second pulse shape can both include 50 uA-30 ns or 100 uA-50 ns. Alternatively, the first pulse shape and the second pulse shape can include 80 uA-30 ns and 80 uA-50 ns respectively, or 80 uA-50 ns and 100 uA-50 ns respectively. In implementations, first and second recovery pulses with different pulse shapes can be applied to memory cells at different determined resistance levels.

Figure 13:
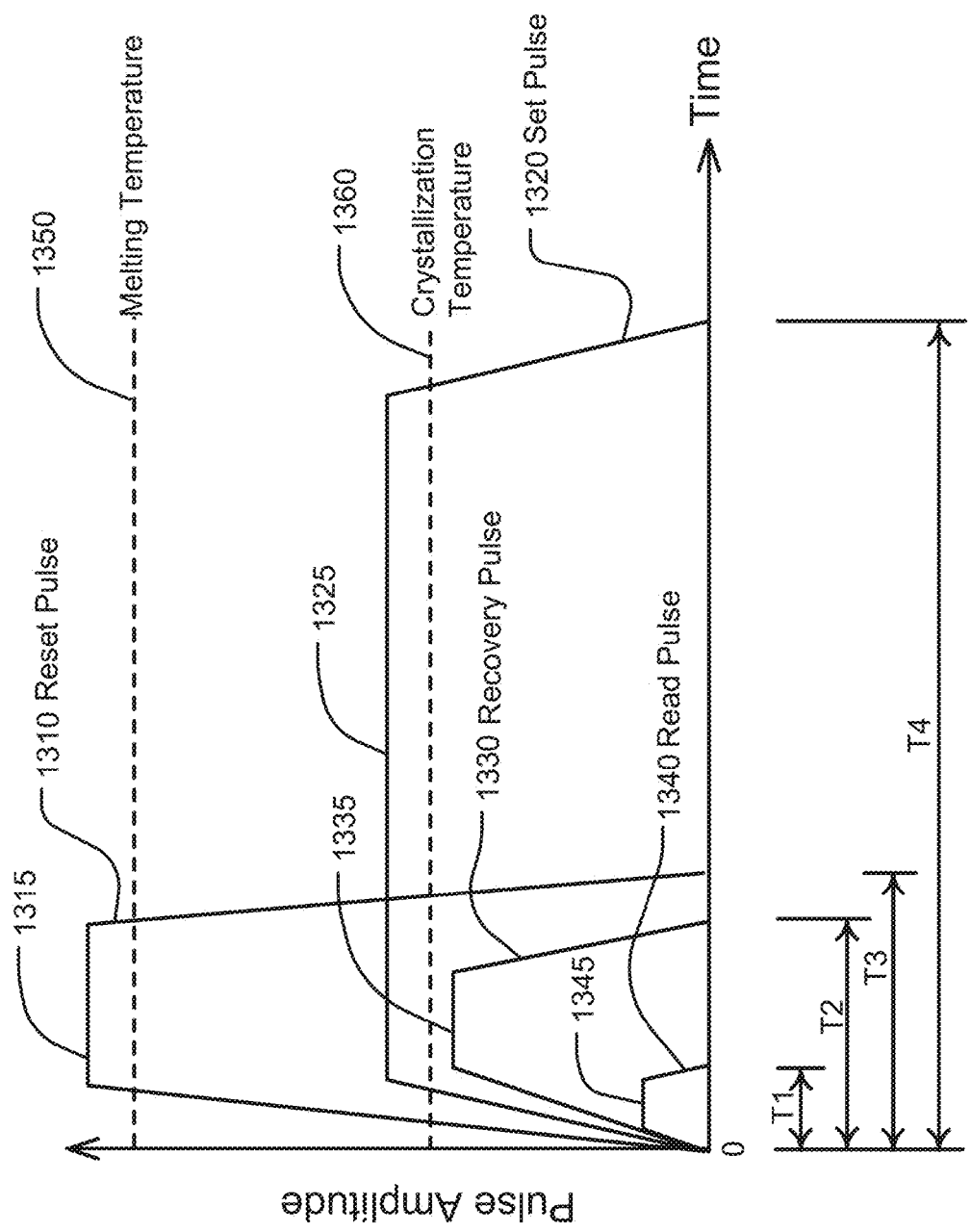
FIG. 13 illustrates example set, reset, read and recovery pulses for phase change memory cells.

FIG. 13 illustrates example set, reset, read and recovery pulses for phase change memory cells. A recovery pulse can be applied in a resistance drift recovery process as described herein. The reset, set, recovery and read pulses (e.g. 1310, 1320, 1330, 1340 respectively) can be characterized by parameters including amplitude in voltage, current or power, and a time duration. For purpose of comparison between different types of pulses applied on memory cells, the set, reset, read and recovery pulses are shown as starting from time 0. In write (e.g. set and reset), read and drift recovery operations, the set, reset, read and recovery pulses are applied at different times. As used herein, the term "program pulse" can refer to a reset pulse applied to a memory cell to reset the memory cell into an amorphous phase, and to a set pulse applied to a memory cell to set the memory cell into a crystalline phase.

A recovery pulse can have an amplitude lower than an amplitude of a reset pulse and higher than an amplitude of a read pulse, and a time duration shorter than a time duration of a set pulse and longer than a time duration of a read pulse. For instance, a recovery pulse can have an amplitude less than half of an amplitude of a reset pulse, and a time duration about one fifth of a time duration of a set pulse. A recovery pulse is further described in connection to FIGS. 6A, 6B, 6C, 7A, 7B and 7C.

In operation of a memory cell including a phase change memory element, an electrical pulse passed through the memory cell can set or reset the resistivity phase of the phase change memory element. To reset the memory element into the amorphous phase, a reset pulse (e.g. 1310) with a large amplitude for a short time duration can be used to heat up an active region of the memory element to a melting temperature (e.g. 1350), and then cool quickly causing it to solidify in the amorphous phase. To set the memory element into the crystalline phase, a set pulse (e.g. 1320) with a medium amplitude, which causes it to heat up to a crystallization temperature (e.g. 1360), and a longer cooling time duration can be used allowing the active region to solidify in a crystalline phase. To read the state of the memory element, a read pulse (e.g. 1340) with a small amplitude for a shorter time duration is applied to the selected cell and the resulting electrical current is sensed.

For instance, a recovery pulse can have a current amplitude (e.g. 1335) between 50 uA and 100 uA and a time duration (e.g. T2) between 30 ns and 50 ns. A set pulse can have a current amplitude (e.g. 1325) of between 100 uA and 200 uA and a time duration (e.g. T4) between 100 ns to 500 ns. A reset pulse can have a current amplitude (e.g. 1315) of about 400 uA and a time duration (e.g. T3) between 50 ns and 100 ns. A read pulse can have a current amplitude (e.g. 1345) of about 30 uA and a time duration (e.g. Ti) of about 50 ns.

Figure 14:
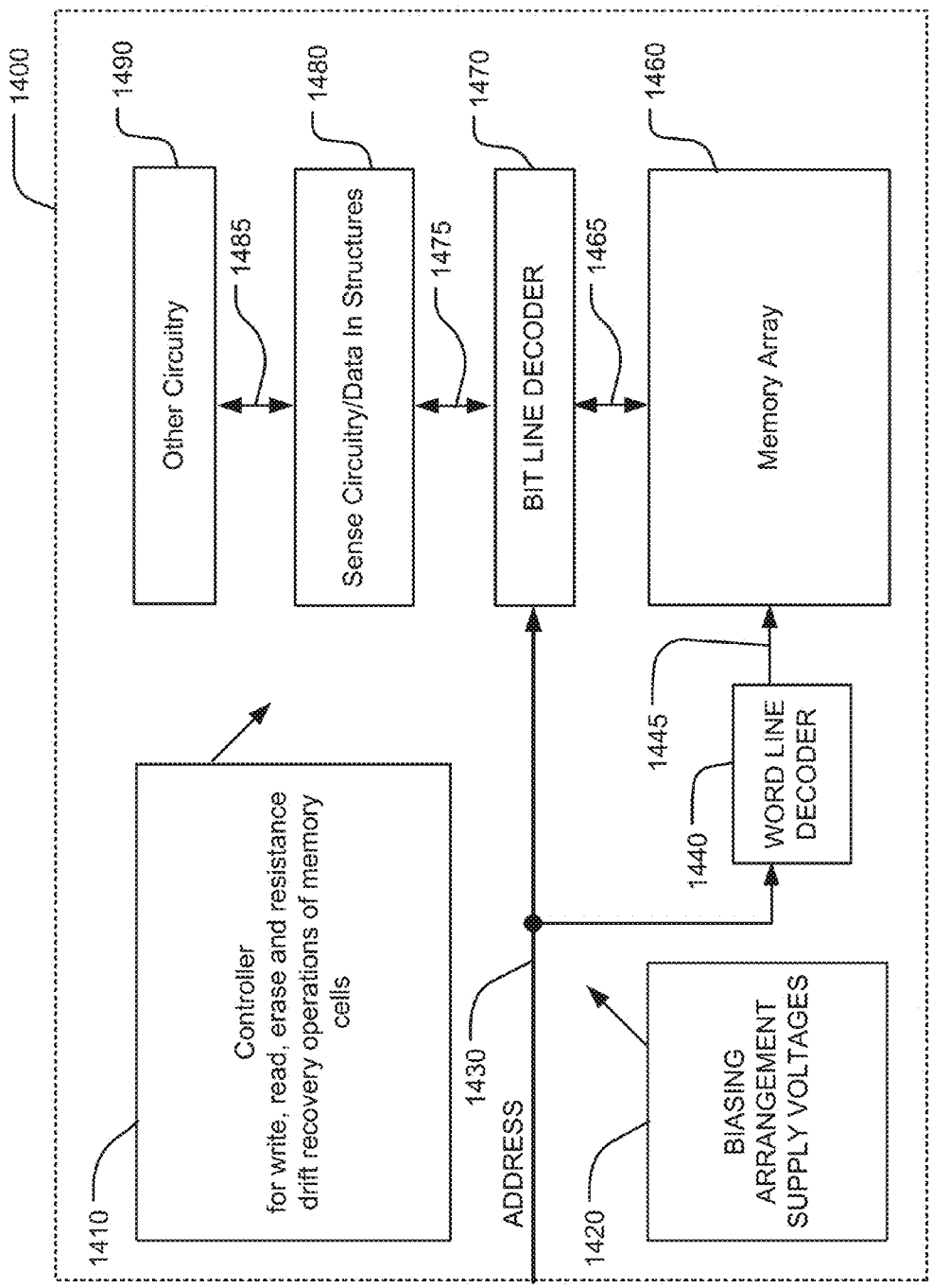
FIG. 14 is a simplified block diagram of a memory circuit.

FIG. 14 is a simplified block diagram of a memory device (e.g. 1400). The memory device includes a memory array of memory cells including programmable resistive memory elements (e.g. 1460). In some embodiments, the array 1460 can include single levels of cells (SLC). In other embodiments, the array 1460 can include multiple levels of cells (MLC).

Memory device 1400 includes controller (e.g. 1410) coupled to the array. The controller 1410, implemented for example as a state machine, provides signals to control the application of bias arrangement supply voltages generated or provided through the voltage supply or supplies in block 1420 to carry out the various operations including write, read, erase and drift recovery operations of memory cells. The controller can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

The controller 1410 is configured to program memory cells in the array to store data by applying program pulses to the memory cells to establish resistance levels within a number N of specified ranges of resistance, where each of the specified ranges corresponds to a particular data value, and to execute a drift recovery process to the memory cells in the array, including applying a recovery pulse having a pulse shape to a set of programmed memory cells, where memory cells in the set of programmed memory cells, to which the recovery pulse having the pulse shape is applied, have resistance levels within two or more of the specified resistance ranges. The drift recovery process can be interrupted in response to an external command, such as a command from a source external to the memory device 1400.

The N specified ranges include a higher resistance range in which the memory cells have active regions including a first volume of amorphous phase material, and a lower resistance range in which the memory cells have active regions including a second volume of amorphous phase material smaller than the first volume. The pulse shape is configured to cause a temperature above a melting point in active regions in memory cells in the higher resistance range, and to cause a temperature below the melting point in active regions in memory cells in the lower resistance range. The N specified ranges can include one or more intermediate resistance ranges in which the memory cells have active regions including volumes of amorphous phase material between the first volume and the second volume, where the one or more intermediate resistance ranges are between the higher resistance range and the lower resistance range. The number N can be greater than 2, and the memory cells in the set of programmed memory cells can have resistance levels in all N of the specified ranges.

The controller 1410 can be configured to apply a set of recovery pulses including the first-mentioned recovery pulse having the first-mentioned pulse shape and a second recovery pulse having a second pulse shape corresponding to the determined resistance level of the memory cell in the set to the memory cell. The first-mentioned pulse shape can be different than the second pulse shape, or the same as the second pulse shape.

The controller 1410 can be configured to read memory cells in the set to determine resistance levels of the memory cells in the set, and to apply recovery pulses having respective pulse shapes corresponding to the determined resistance levels to memory cells at the determined resistance levels in the set. The controller 1410 can be configured to read memory cells in the set to determine resistance levels of the memory cells in the set, and to apply recovery pulses having a same pulse shape to memory cells at two or more determined resistance levels in the set. The controller 1410 can be configured to apply recovery pulses having a same pulse shape to memory cells at multiple resistance levels in the set, without first reading memory cells in the set to determine resistance levels of the memory cells in the set.

At least one of the recovery pulses as described herein can be independent of data values of the programmed memory cells.

In some embodiments, the memory array 1460 can include single level cells (SLC). In other embodiments, the memory array 1460 can include multiple level cells (MLC). A word line decoder 1440 is coupled to a plurality of word lines 1445 arranged along rows in the memory array 1460. A bit line decoder 1470 is coupled to the memory array 1460 via global bit lines 1465. Global bit lines 1465 are coupled to local bit lines (not shown) arranged along columns in the memory array 1460. Addresses are supplied on bus 1430 to bit line decoder 1470 (column address) and word line decoder 1440 (row address). Sense circuitry/data-in structures in block 1480, including voltage and/or current sources for the write, read, erase and resistance drift recovery operations, are coupled to bit line decoder 1470 via data bus 1475. Data is supplied via the line 1485 to/from other circuitry 1490 on the integrated circuit, such as a general purpose processor or special purpose application circuitry, or a combination of modules providing system-on-a-chip functionality supported by the memory device 1400. Other circuitry 1490 can include for example input/output ports.

While the present technology is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the technology and the scope of the following claims.

The invention claimed is:

1. A method for operating a memory device including an array of memory cells, comprising:
   programming memory cells in the array to store data by applying program pulses to the memory cells to establish resistance levels within a number N of specified ranges of resistance;
   executing a drift recovery process to the memory cells in the array, including applying a recovery pulse having a pulse shape to a set of programmed memory cells, wherein memory cells in the set of programmed memory cells have resistance levels within two or more of the specified resistance ranges; and
   applying recovery pulses having a same pulse shape to memory cells at two or more determined resistance levels in the set, wherein the same pulse shape is defined by parameters including an amplitude in voltage.

2. The method of claim 1, the N specified ranges including a higher resistance range in which the memory cells have active regions including a first volume of amorphous phase material, and a lower resistance range in which the memory cells have active regions including a second volume of amorphous phase material smaller than the first volume, and the pulse shape is configured to cause a temperature above a melting point in active regions in memory cells in the higher resistance range, and to cause a temperature below the melting point in active regions in memory cells in the lower resistance range.

3. The method of claim 2, the N specified ranges including one or more intermediate resistance ranges in which the memory cells have active regions including volumes of amorphous phase material between the first volume and the second volume, the one or more intermediate resistance ranges being between the higher resistance range and the lower resistance range.

4. The method of claim 1, wherein N is greater than 2, and the memory cells in the set of programmed memory cells have resistance levels in all N of the specified ranges.

5. The method of claim 1, comprising:
   applying a set of recovery pulses including the first-mentioned recovery pulse having the first-mentioned pulse shape and a second recovery pulse having a second pulse shape corresponding to a determined resistance level of a memory cell in the set to the memory cell.

6. The method of claim 1, wherein each of the specified ranges corresponds to a particular data value.

7. The method of claim 1, comprising:
   reading memory cells in the set to determine resistance levels of the memory cells in the set; and
   applying recovery pulses having respective pulse shapes corresponding to the determined resistance levels to memory cells at the determined resistance levels in the set, after said reading memory cells.

8. The method of claim 1, comprising:
   reading memory cells in the set to determine resistance levels of the memory cells in the set prior to said applying recovery pulses.

9. The method of claim 1, comprising:
   triggering the drift recovery process on one or more groups of the memory cells in the array when errors are detected by an error correcting code (ECC) scheme.

10. The method of claim 1, comprising:
    triggering the drift recovery process on one or more groups of the memory cells in the array when a specified drift resistance threshold is reached by at least some of the memory cells in the array.

11. A memory device, comprising:
    an array of memory cells including programmable resistive memory elements; and
    a controller coupled to the array, and configured to program memory cells in the array to store data by applying program pulses to the memory cells to establish resistance levels within a number N of specified ranges of resistance; to execute a drift recovery process to the memory cells in the array, including applying a recovery pulse having a pulse shape to a set of programmed memory cells, wherein memory cells in the set of programmed memory cells have resistance levels within two or more of the specified resistance ranges, and to apply recovery pulses having a same pulse shape to memory cells at two or more determined resistance levels in the set, wherein the same pulse shape is defined by parameters including an amplitude in voltage.

12. The memory device of claim 11, the N specified ranges including a higher resistance range in which the memory cells have active regions including a first volume of amorphous phase material, and a lower resistance range in which the memory cells have active regions including a second volume of amorphous phase material smaller than the first volume, and the pulse shape is configured to cause a temperature above a melting point in active regions in memory cells in the higher resistance range, and to cause a temperature below the melting point in active regions in memory cells in the lower resistance range.

13. The memory device of claim 12, the N specified ranges including one or more intermediate resistance ranges in which the memory cells have active regions including volumes of amorphous phase material between the first volume and the second volume, the one or more intermediate resistance ranges being between the higher resistance range and the lower resistance range.

14. The memory device of claim 11, wherein N is greater than 2, and the memory cells in the set of programmed memory cells have resistance levels in all N of the specified ranges.

15. The memory device of claim 11, the controller configured to apply a set of recovery pulses including the first-mentioned recovery pulse having the first-mentioned pulse shape and a second recovery pulse having a second pulse shape corresponding to a determined resistance level of a memory cell in the set to the memory cell.

16. The memory device of claim 11, wherein each of the specified ranges corresponds to a particular data value.

17. The memory device of claim 11, the controller configured to:
read memory cells in the set to determine resistance levels of the memory cells in the set; and
apply recovery pulses having respective pulse shapes corresponding to the determined resistance levels to memory cells at the determined resistance levels in the set, after the memory cells in the set are read.

18. The memory device of claim 11, the controller configured to:
read memory cells in the set to determine resistance levels of the memory cells in the set prior to said
recovery pulses are applied.

19. The memory device of claim 11, the controller configured to:
trigger the drift recovery process on one or more groups of the memory cells in the array periodically.

20. The memory device of claim 11, the controller configured to:
trigger the drift recovery process on one or more groups of the memory cells in the array when errors are detected by an error correcting code (ECC) scheme.

21. The memory device of claim 11, the controller configured to:
trigger the drift recovery process on one or more groups of the memory cells in the array when a specified drift resistance threshold is reached by at least some of the memory cells in the array.

22. A method for operating a memory device including an array of memory cells, comprising:
programming memory cells in the array to store data by applying program pulses to the memory cells to establish resistance levels within a number N of specified ranges of resistance;
executing a drift recovery process to the memory cells in the array, including applying a recovery pulse having a pulse shape to a set of programmed memory cells, wherein memory cells in the set of programmed memory cells have resistance levels within two or more of the specified resistance ranges; and
triggering the drift recovery process on one or more groups of the memory cells in the array periodically.

* * * * *